United States Patent
Koyama

(10) Patent No.: US 7,015,521 B2
(45) Date of Patent: Mar. 21, 2006

(54) SOLID-STATE IMAGING DEVICE AND DRIVING METHOD OF THE SAME

(75) Inventor: Eiji Koyama, Soraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 113 days.

(21) Appl. No.: 10/825,845

(22) Filed: Apr. 15, 2004

(65) Prior Publication Data
US 2004/0222449 A1    Nov. 11, 2004

(30) Foreign Application Priority Data
Apr. 15, 2003  (JP) .............................. 2003-110236

(51) Int. Cl.
*H01L 31/062* (2006.01)

(52) U.S. Cl. ...................... 257/292; 257/461; 257/462; 257/465

(58) Field of Classification Search ................ 257/291, 257/292, 461, 462, 465

See application file for complete search history.

(56) References Cited

U.S. PATENT DOCUMENTS 6,483,163 B1 * 11/2002 Isogai et al. ................. 257/446
6,781,169 B1 *  8/2004 Roy ............................ 257/292

FOREIGN PATENT DOCUMENTS

JP           11-195778        7/1999

* cited by examiner

*Primary Examiner*—Sara Crane
(74) *Attorney, Agent, or Firm*—David G. Conlin; David A. Tucker; Edwards Angell Palmer & Dodge LLP

(57) ABSTRACT

A solid-state imaging device is provided, which comprising at least one unit pixel portion. Each of the at least one unit pixel portion comprises a light receiving portion for subjecting incident light to photoelectric conversion to output electric charges, and an optical signal detecting portion comprising a first conductivity type buried region for accumulating the output electric charges. The light receiving portion comprises at least a portion of a second conductivity type impurity diffusion region, and at least a portion of a first conductivity type well region provided between a second conductivity type well region and the second conductivity type impurity diffusion region. The second conductivity type well region and the second conductivity type impurity diffusion region are separated from each other.

14 Claims, 16 Drawing Sheets

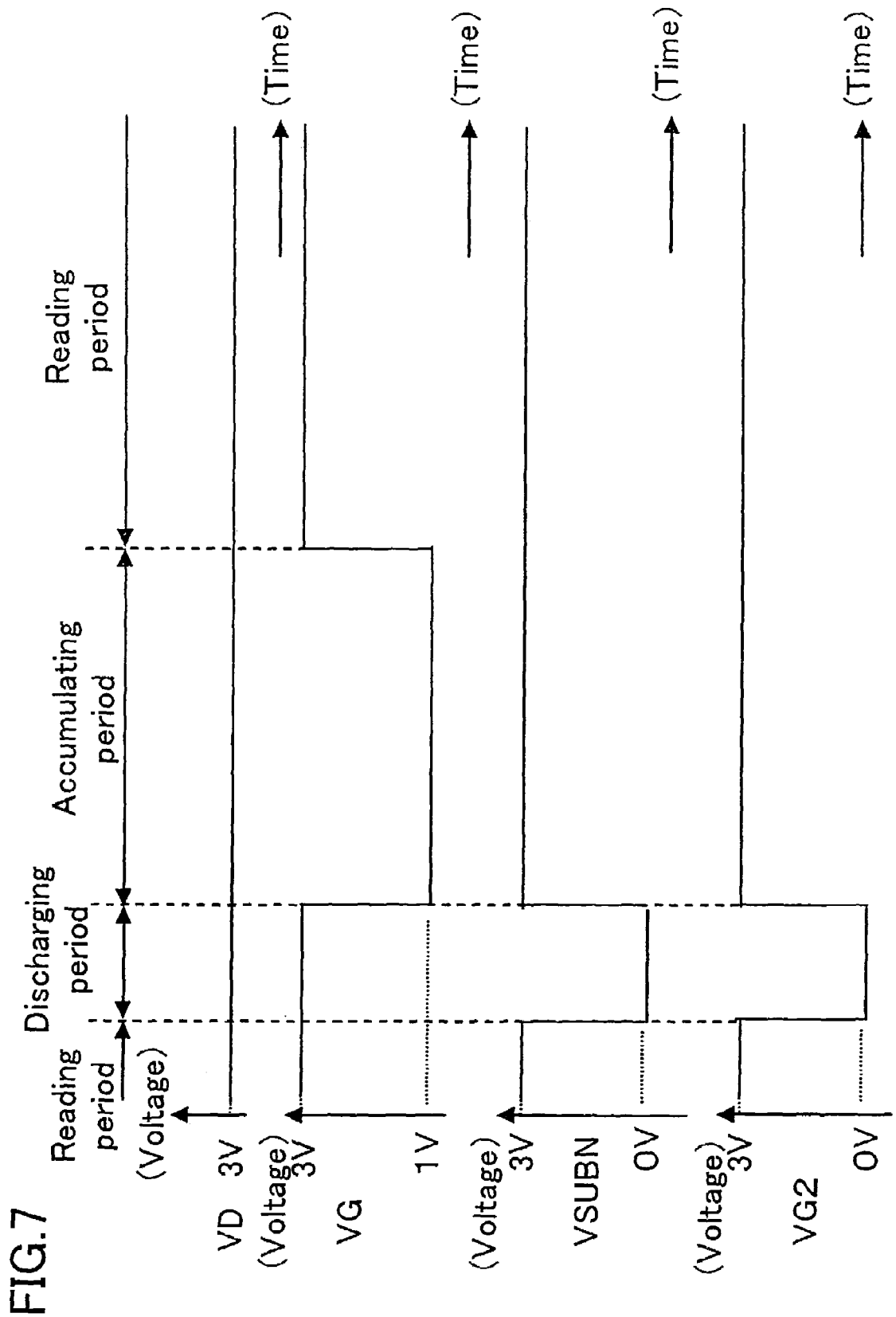

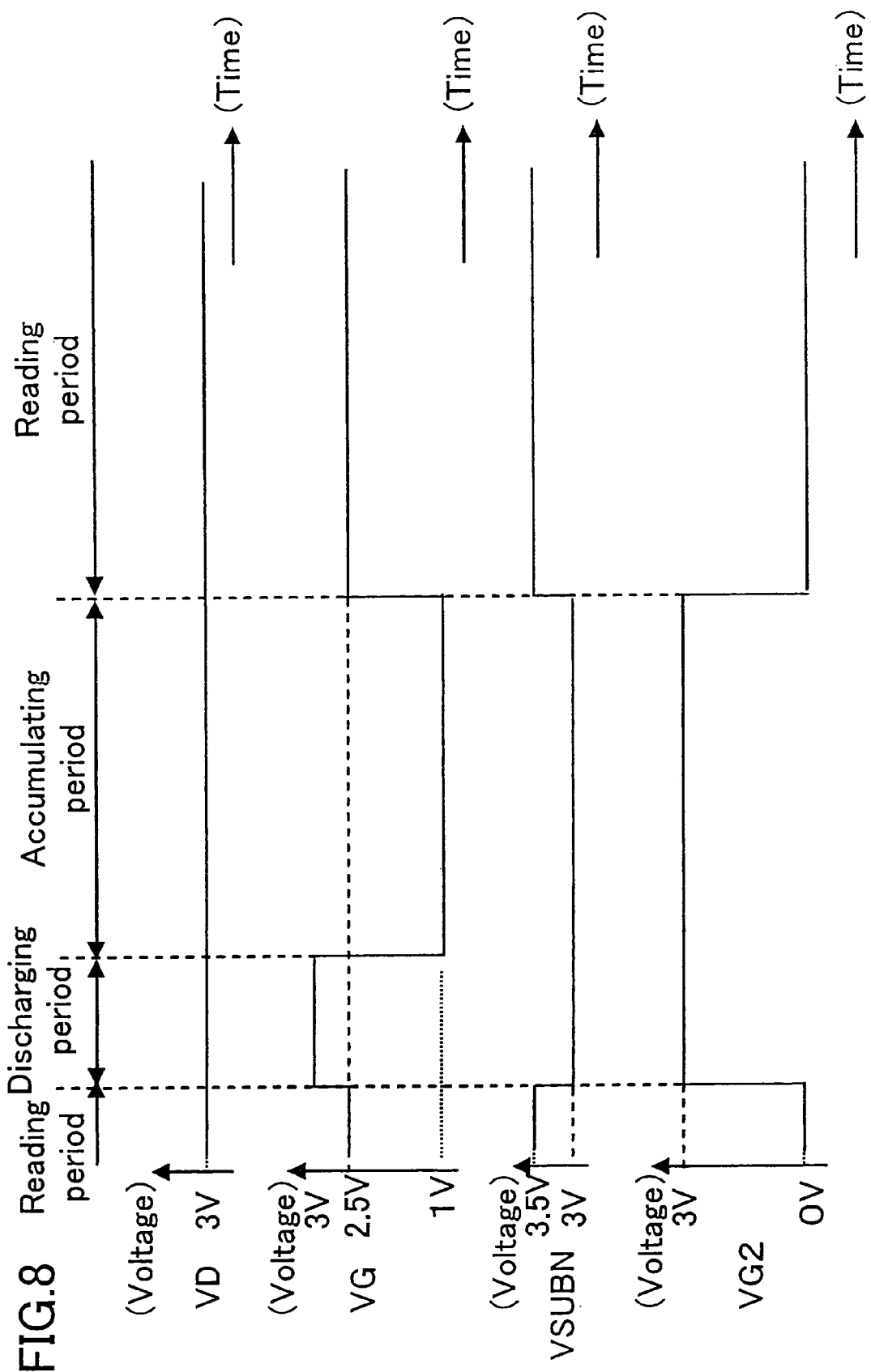

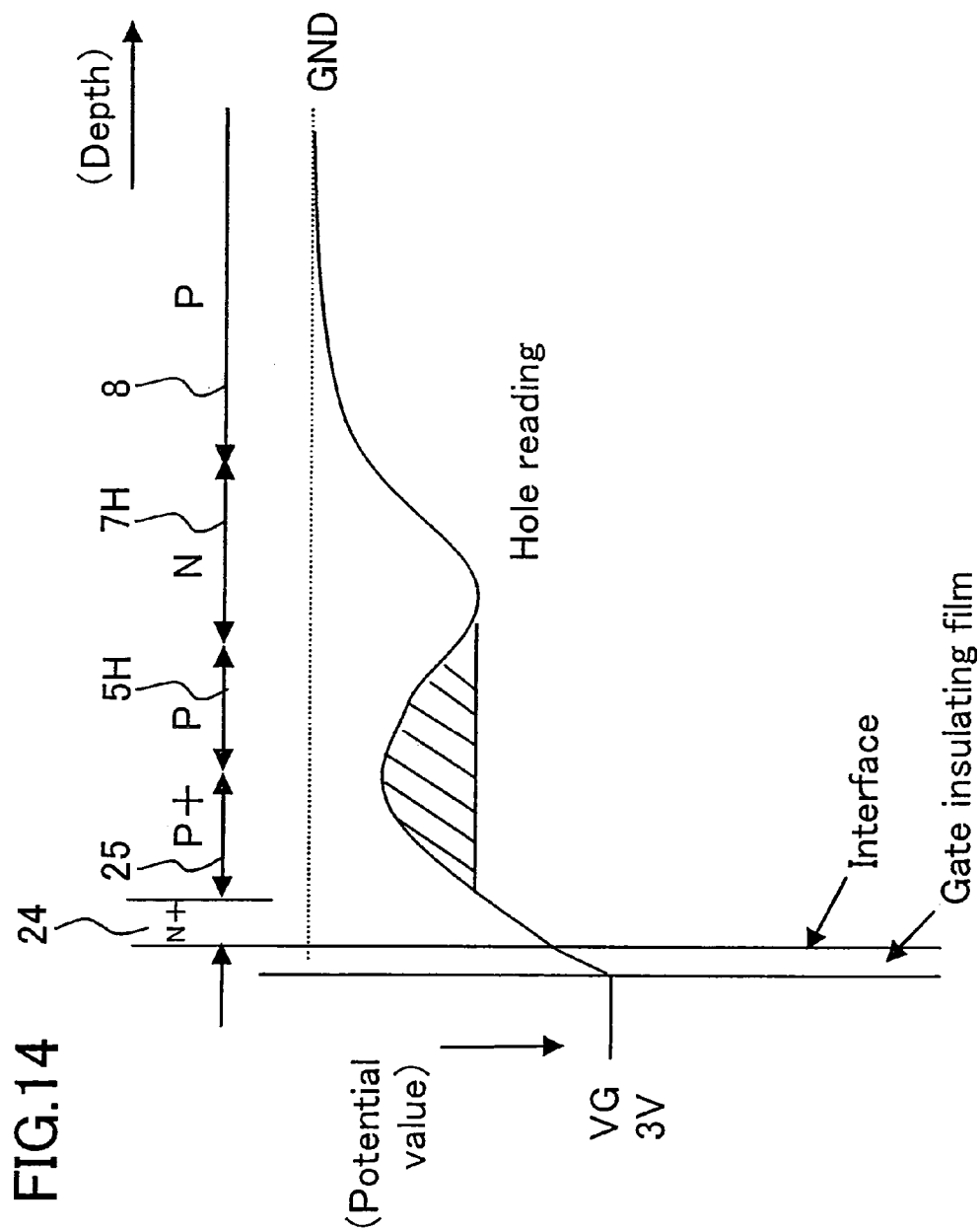

SOLID-STATE IMAGING DEVICE AND DRIVING METHOD OF THE SAME

This non-provisional application claims priority below 35 U.S.C. §119(a) on Patent Application No. 2003-110236 filed in Japan on Apr. 15, 2003, the entire contents of which are hereby incorporated by reference.

BACKGROUND OF THE INVENTION

1. Field of the Invention

The present invention relates to a solid-state imaging device and a driving method thereof, which are used in image inputting apparatuses (e.g., video cameras, electronic cameras (digital cameras), image inputting cameras, scanners, facsimile machines, etc.), and the like.

2. Description of the Related Art

Conventionally, semiconductor image sensors, such as CCD-based image sensors, MOS-based image sensors, and the like, have been used as solid-state imaging devices. Such semiconductor image sensors are employed in most image inputting apparatuses. Particularly, the merits of MOS-based image sensors are recently recognized once again, i.e., that the power consumption is low and they can be fabricated with the same CMOS techniques as those used for peripheral circuits thereof.

Such a recent trend in technology is shown in, for example, Japanese Laid-Open Publication No. 11-195778 (Japanese Patent No. 2935492), which discloses a modified MOS-based image sensor (solid-state imaging device). This is a threshold voltage modulating MOS-based image sensor which has a carrier pocket region (high-concentration buried region) below a channel region of an optical signal detecting MOS transistor. This MOS-based image sensor will be described with reference to FIG. 11.

FIG. 11 is a cross-sectional view showing a unit pixel portion of a conventional MOS-based image sensor 20H.

In the MOS-based image sensor 20H, a plurality of unit pixel portions 3H are arranged in a matrix. Each unit pixel portion 3H has a light receiving diode 1H for photoelectric conversion, and an optical signal detecting MOS transistor 2H (insulated gate field effect transistor) adjacent thereto. Adjacent unit pixel portions 3H are separated from each other by a field oxide film 4. The light receiving diode 1H and the MOS transistor 2H are provided within a P-type well region 5H.

The light receiving diode 1H has a P-type well region 51H (a portion of the P-type well region 5H), in which electric charges are generated due to photoelectric conversion, and an N-type impurity diffusion region 6 provided on an upper surface of the P-type well region 51H. The N-type impurity diffusion region 6 is buried in the P-type well region 51H.

The MOS transistor 2H has a gate electrode 21, an N-type source region 22, an N-type drain region 23, a channel region 24 in which electric charges are transferred, and a P-type hole pocket region 25.

The gate electrode 21 is provided via a gate insulating film (not shown) on the P-type well region 5H. The gate electrode 21 is in the shape of a ring, when viewed from the top.

The N-type source region 22 is located inside the annular gate electrode 21 and on an upper surface of the P-type well region 5H. The N-type source region 22 functions as a source diffusion region.

The N-type drain region 23 is provided on the upper surface of the P-type well region 5H, surrounding the outer circumference of the annular gate electrode 21. The N-type drain region 23 functions as a drain diffusion region. The N-type drain region 23 is in the shape of a ring, when viewed from the top. The N-type drain region 23 is integrated with the N-type impurity diffusion region 6. An end portion of the outer circumference of the N-type impurity diffusion region 6 is connected to an N-type well region 7H which surrounds the P-type well region 5H.

The channel region 24 is located below the gate electrode 21 and on the upper surface of the P-type well region 5H between the N-type source region 22 and the N-type drain region 23. The channel region 24 is provided as an N-type impurity region (N-type impurity layer).

The P-type hole pocket region 25 is located below the gate electrode 21 and within the P-type well region 5H near the N-type source region 22, surrounding the N-type source region 22. The P-type hole pocket region 25 is in the shape of a ring, when viewed from the top. The P-type hole pocket region 25 is provided as a P-type high-concentration buried region having an impurity concentration higher than that of the P-type well region 5H.

The P-type well region 5H is provided within the N-type well region 7H on a P-type semiconductor substrate 8. The N-type well region 7H is separated from other N-type well regions 7H adjacent thereto via the above-described field oxide film 4 and the P-type separation region 9.

A basic operation of the MOS-based image sensor 20H will be described with reference to a timing chart of FIG. 12. The MOS-based image sensor 20H performs a series of imaging operations, i.e., an initializing (discharging) operation, an accumulating operation, and a reading operation.

As shown in FIG. 12, during a discharging period, the drain voltage VD of the drain region 23 and the gate voltage VG of the gate electrode 21 are set to be as high as about 5 V for initialization. In this case, the potential of the source region 22 is also set to be about 5 V via the channel region 24. The potential distribution of the device 20H during the discharging period is shown in FIG. 13.

FIG. 13 is a diagram showing the potential distribution of the device 20H along a plane passing through the hole pocket region 25 in a direction (depth direction) perpendicular to the substrate surface, during the discharging period. The vertical axis represents a potential value, while the horizontal axis represents a depth (distance) from the upper surface of a unit pixel portion.

Referring to FIG. 13, the potential values of the gate insulating film, the N-type (N+) channel region 24, the P-type (P+) hole pocket region 25, the P-type well region 5H, the N-type well region 7H, and the P-type semiconductor substrate 8 vary from the gate voltage VG (5 V) to GND (0V).

According to such a potential distribution, substantially all electric charges (holes) accumulated in the hole pocket region 25 are discharged to the P-type semiconductor substrate 8.

Next, during an accumulation period, the drain voltage VD is reduced to 3 V as shown in FIG. 12. In this case, electric charges are generated by photoelectric conversion within the P-type well region 51H of the light receiving diode 1H. In this case, the gate voltage VG is reduced to 1 V. Thereby, the MOS transistor 2H is turned off, so that electric charges (holes) are accumulated in the hole pocket region 25 which has the lowest potential.

Further, during a reading period, a constant current source is connected to the source region 22, and the drain region 23, the gate electrode 21 and the source region 22 form a source follower circuit. In this case, the gate voltage VG is increased to 3 V to operate the MOS transistor 2H at a saturated state thereof. In this case, the source potential is modulated depending on the amount of electric charges accumulated in the hole pocket region 25. By reading a signal indicating such a modulation, the amount of incident light can be detected. FIG. 14 shows a potential distribution during the reading period.

FIG. 14 is a diagram showing the potential distribution of the device 20H along a plane passing through the hole pocket region 25 in a direction (depth direction) perpendicular to the substrate surface, during the reading period. The vertical axis represents a potential value, while the horizontal axis represents a depth (distance) from the upper surface of a unit pixel portion.

Referring to FIG. 14, the potential values of the gate insulating film, the N-type (N+) channel region 24, the P-type (P+) hole pocket region 25, the P-type well region 5H, the N-type well region 7H, and the P-type semiconductor substrate 8 vary from the gate voltage VG (3 V) to GND (0V).

The potential value of the hole pocket region 25 and the P-type well region 5H is lower than that of the N-type well region 7H. Therefore, the N-type well region 7H functions as a potential barrier between the P-type well region 5H and the P-type semiconductor substrate 8, so that electric charges are accumulated in the hole pocket region 25. In FIG. 14, a hatched portion indicates the maximum amount of electric charges which can be accumulated in the hole pocket region 25.

In the MOS-based image sensor 20H, electric charges accumulated in the hole pocket region 25 need to be completely discharged to the P-type semiconductor substrate 8 during a discharging period. In order to keep the N-type well region 7H from being a barrier against discharging of electric charges to the P-type semiconductor substrate 8, the potential of the hole pocket region 25 needs to be higher than that of the N-type well region 7H.

To achieve such a potential distribution, it is necessary to use a voltage (5 V in the embodiment of FIGS. 12 and 13) higher than operation voltages (1 V and 3 V in the embodiment of FIGS. 12 and 13). Such a high voltage can be obtained by providing a specialized power supply externally or a booster circuit having a capacitor inside a chip. When a booster circuit is provided inside a chip, the area of the chip is increased because a capacitor or the like is required. In addition, it may be necessary to construct a process for manufacturing a transistor which withstands a high voltage.

SUMMARY OF THE INVENTION

According to an aspect of the present invention, a solid-state imaging device is provided, which comprises at least one unit pixel portion. Each of the at least one unit pixel portion comprises a light receiving portion for subjecting incident light to photoelectric conversion to output electric charges, and an optical signal detecting portion comprising a first conductivity type buried region for accumulating the output electric charges. The light receiving portion comprises at least a portion of a second conductivity type impurity diffusion region, and at least a portion of a first conductivity type well region provided between a second conductivity type well region and the second conductivity type impurity diffusion region. The second conductivity type well region and the second conductivity type impurity diffusion region are separated from each other.

In one embodiment of this invention, the light receiving portion is a light receiving diode, and the optical signal detecting portion is a transistor.

In one embodiment of this invention, the optical signal detecting portion comprises a second conductivity type drain diffusion region integrated with the second conductivity type impurity diffusion region, a second conductivity type source diffusion region, a gate electrode, and a channel region. The first conductivity type buried region is provided within the first conductivity type well region, and the first conductivity type buried region is provided closer to the second conductivity type source diffusion region than to the second conductivity type drain diffusion region. An impurity concentration of the first conductivity type buried region is higher than an impurity concentration of the first conductivity type well region.

In one embodiment of this invention, the solid-state imaging device further comprises a terminal portion for applying a predetermined potential to the second conductivity type well region.

In one embodiment of this invention, the solid-state imaging device comprises a plurality of the unit pixel portions arranged in a predetermined direction. The terminal portion is shared by the plurality of the unit pixel portions arranged in the predetermined direction.

In one embodiment of this invention, the second conductivity type impurity diffusion region and the second conductivity type well region are separated from each other via the first conductivity type well region. A channel region is provided at a position in the first conductivity type well region, the position being located between the second conductivity type impurity diffusion region and the second conductivity type well region.

In one embodiment of this invention, the solid-state imaging device further comprises a gate terminal for applying a predetermined potential to the channel region.

In one embodiment of this invention, a conduction between the second conductivity type well region and the second conductivity type impurity diffusion region varies depending on a change in a potential of the gate terminal.

In one embodiment of this invention, at least a portion of the second conductivity type well region is provided between a first conductivity type semiconductor substrate and the first conductivity type well region. An impurity concentration of each of the second conductivity type well region and the first conductivity type buried region is such that when substantially the same potential is applied to the second conductivity type drain diffusion region, the gate electrode, and the second conductivity type well region, electric charges accumulated in the first conductivity type buried region are transferred to the first conductivity type semiconductor substrate.

According to another aspect of the present invention, a method is provided for driving a solid-state imaging device. The solid-state imaging device comprises at least one unit pixel portion. Each of the at least one unit pixel portion comprises a light receiving portion for subjecting incident light to photoelectric conversion to output electric charges, and an optical signal detecting portion comprising a first conductivity type buried region for accumulating the output electric charges. The light receiving portion comprises at least a portion of a second conductivity type impurity diffusion region, and at least a portion of a first conductivity type well region provided between a second conductivity type well region and the second conductivity type impurity diffusion region. The second conductivity type well region and the second conductivity type impurity diffusion region are separated from each other. At least a portion of the second conductivity type well region is provided between a first conductivity type semiconductor substrate and the first conductivity type well region. The method comprises the step of applying a potential, which is lower than a potential applied to the second conductivity type impurity diffusion region, to the second conductivity type well region during a period, in which electric charges accumulated in the first conductivity type buried region are discharged to the first conductivity type semiconductor substrate.

In one embodiment of this invention, the second conductivity type impurity diffusion region and the second conductivity type well region are separated from each other via the first conductivity type well region. A channel region is provided at a position in the first conductivity type well region, the position being located between the second conductivity type impurity diffusion region and the second conductivity type well region. The method further comprises the step of applying a predetermined potential to the channel region during the discharging period to electrically cut off the second conductivity type impurity diffusion region from the second conductivity type well region.

According to another aspect of the present invention, a method is provided for driving a solid-state imaging device. The solid-state imaging device comprises at least one unit pixel portion. Each of the at least one unit pixel portion comprises a light receiving portion for subjecting incident light to photoelectric conversion to output electric charges, and an optical signal detecting portion comprising a first conductivity type buried region for accumulating the output electric charges. The light receiving portion comprises at least a portion of a second conductivity type impurity diffusion region, and at least a portion of a first conductivity type well region provided between a second conductivity type well region and the second conductivity type impurity diffusion region. The second conductivity type well region and the second conductivity type impurity diffusion region are separated from each other. The method comprising the step of applying a potential, which is higher than a potential applied to the second conductivity type impurity diffusion region, to the second conductivity type well region during a period, in which the amount of electric charges accumulated in the first conductivity type buried region are read out.

In one embodiment of this invention, the second conductivity type impurity diffusion region and the second conductivity type well region are separated from each other via the first conductivity type well region. A channel region is provided at a position in the first conductivity type well region, the position being located between the second conductivity type impurity diffusion region and the second conductivity type well region. The method further comprises the step of applying a predetermined potential to the channel region during the reading period to electrically cut off the second conductivity type impurity diffusion region from the second conductivity type well region.

In one embodiment of this invention, the optical signal detecting portion comprises a second conductivity type drain diffusion region integrated with the second conductivity type impurity diffusion region, a second conductivity type source diffusion region, a gate electrode, and a channel region. The method further comprises the step of applying a potential, which is lower than a potential applied to the second conductivity type impurity diffusion region, to the gate electrode during the reading period.

Hereinafter, functions of the present invention will be described.

According to the present invention, a second conductivity type well region is separated from a second conductivity type impurity diffusion region. Therefore, a potential, which is different from a potential applied to the second conductivity type impurity diffusion region, can be applied to the second conductivity type well region.

During a discharging period, in which electric charges accumulated in a first conductivity type buried region are discharged to a first conductivity type semiconductor substrate, by applying a potential, which is lower than a potential applied to the second conductivity type impurity diffusion region, to the second conductivity type well region, it is possible to reduce a potential barrier formed by the second conductivity type well region between the first conductivity type semiconductor substrate and the first conductivity type buried region. Thereby, as compared with conventional techniques (where the second conductivity type impurity diffusion region has the same potential as that of the second conductivity type well region), it is possible to reduce a voltage applied to the second conductivity type impurity diffusion region or the gate electrode during the discharging period. Therefore, a special external power supply apparatus, an internal booster circuit, and the like are not required, thereby making it possible to reduce power consumption and chip size.

During a period in which electric charges accumulated in the first conductivity type buried region are read out, by applying a potential, which is higher than that applied to the second conductivity type impurity diffusion region, to a second conductivity type well region, it is possible to increase a potential barrier formed by a second conductivity type well region between the first conductivity type semiconductor substrate and the first conductivity type buried region. In this case, it is possible to prevent the overflow of electric charges accumulated in the first conductivity type buried region to the first conductivity type semiconductor substrate. Therefore, even when the impurity concentration of the first conductivity type buried region or the second conductivity type well region is reduced, it is possible to prevent a reduction in the maximum amount of accumulated electric charges.

In addition, a terminal portion for applying a potential to the second conductivity type well region may be shared by a plurality of unit pixel portions arranged in a predetermined direction, thereby making it possible to utilize the areas of pixels effectively. In MOS-based image sensors, a series of imaging operation, such as discharging, accumulating, and reading operations, are typically performed for each row. For this reason, it is preferable to provide a terminal portion for applying a potential to the second conductivity well region, which is common to a plurality of unit pixel portions arranged in a row direction.

Further, a gate terminal is provided in the first conductivity type well region for separating the second conductivity type well region from the second conductivity type impurity diffusion region. By controlling a voltage to the gate terminal portion, it is possible to switch the electrical connection and the electrical cutoff between the second conductivity type well region and the second conductivity type impurity diffusion region.

By applying a voltage to the gate terminal portion so that the second conductivity type well region is electrically connected to the second conductivity type impurity diffusion region during the accumulation period, it is possible to prevent a deterioration in S/N due to a dark current component, which occurs in an exposed portion of the first conductivity type well region. Also, it is possible to apply a voltage to the gate terminal to electrically cut off the second conductivity type well region from the second conductivity type impurity diffusion region, during a discharging period (or a reading period), in which a potential different from a potential applied to the second conductivity type impurity diffusion region is applied to the second conductivity type well region.

Thus, the invention described herein makes possible the advantages of providing a solid-state imaging device and a driving method thereof, in which accumulated electric charges can be reliably discharged to a substrate only using a typically used operation voltage without a higher voltage during a discharging period.

These and other advantages of the present invention will become apparent to those skilled in the art upon reading and understanding the following detailed description with reference to the accompanying figures.

BRIEF DESCRIPTION OF THE DRAWINGS

FIG. 7 is a timing chart showing a driving voltage in Embodiment 3.

FIG. 8 is a timing chart showing a driving voltage in Embodiment 4.

FIG. 14 is a diagram showing a potential distribution during a reading period of the conventional solid-state imaging device of FIG. 11.

DESCRIPTION OF THE PREFERRED EMBODIMENTS

Hereinafter, the present invention will be described by way of illustrative examples with reference to the accompanying drawings.

(Embodiment 1)

Figure 1A:
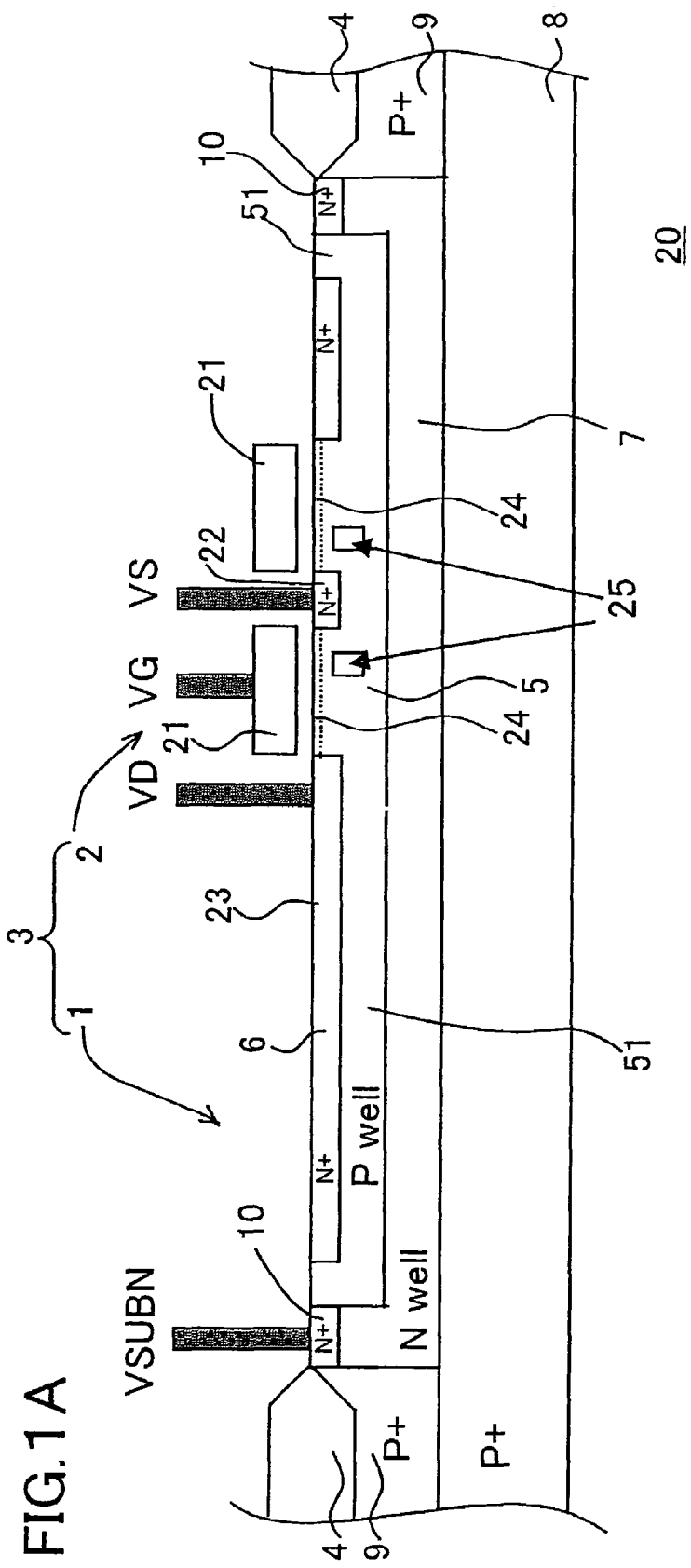
FIG. 1A is a cross-sectional view showing a solid-state imaging device according to Embodiment 1 of the present invention.
Figure 11:
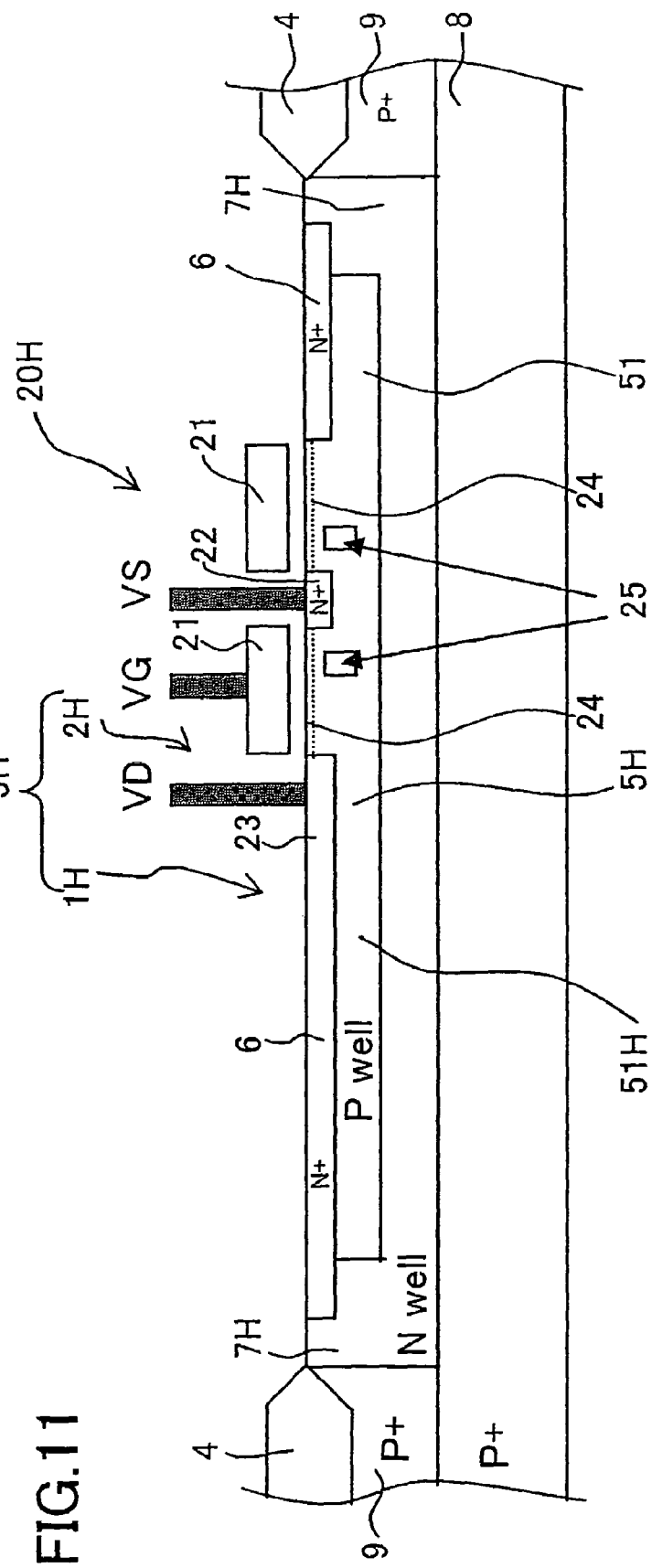
FIG. 11 is a cross-sectional view showing a conventional solid-state imaging device.

FIG. 1A is a cross-sectional view showing a MOS-based image sensor 20, which is a solid-state imaging device according to Embodiment 1 of the present invention. The same components as those of the MOS-based image sensor 20H of FIG. 11 are referred to by the same reference characters and the description thereof is omitted.

The MOS-based image sensor 20 comprises at least one unit pixel portion 3. In the MOS-based image sensor 20 of FIG. 1A, a plurality of unit pixel portions 3 are arranged in a matrix. Each unit pixel portion 3 has a light receiving diode 1 which functions as a light receiving portion for photoelectric conversion, and a MOS transistor 2 (insulated gate field effect transistor) adjacent thereto which functions as an optical signal detection portion. Adjacent unit pixel portions 3 are separated from each other by a field oxide film 4. The light receiving diode 1 and the MOS transistor 2 are provided within a P-type (first conductivity type) well region 5. The light receiving diode 1 subjects incident light to photoelectric conversion to generate and output electric charges. The MOS transistor 2 comprises a P-type hole pocket region 25 for accumulating the electronic charges output by the light receiving diode 1.

An N-type (second conductivity type) well region 7 is provided on the P-type semiconductor substrate 8. A P-type well region 5 is provided on the N-type well region 7 (at least a portion of the N-type well region 7 is provided between the P-type semiconductor substrate 8 and the P-type well region 5.)

The light receiving diode 1 has a P-type well region 51 (a portion of the P-type well region 5), in which electric charges are generated due to photoelectric conversion, and an N-type impurity diffusion region 6 provided on an upper surface of the P-type well region 51. The N-type impurity diffusion region 6 is buried in the P-type well region 51.

The MOS transistor 2 has a gate electrode 21, an N-type source region 22 (N-type source diffusion region), an N-type drain region 23 (N-type drain diffusion region), a channel region 24 in which electric charges are transferred, and a P-type hole pocket region 25 (a first conductivity type high-concentration buried region for accumulation of signal electronic charges).

The gate electrode 21 is provided via a gate insulating film (not shown) on the P-type well region 5. The gate electrode 21 is in the shape of a ring, when viewed from the top.

The N-type source region 22 is located inside the annular gate electrode 21 and on an upper surface of the P-type well region 5.

The N-type drain region 23 is provided on the upper surface of the P-type well region 5, surrounding the outer circumference of the annular gate electrode 21. The N-type drain region 23 is in the shape of a ring, when viewed from the top. The N-type drain region 23 is integrated with the N-type impurity diffusion region 6. The N-type drain region 23 and the N-type impurity diffusion region 6 are provided within the P-type well region 5.

The channel region 24 is located below the gate electrode 21 and on the upper surface of the P-type well region 5 between the N-type source region 22 and the N-type drain region 23. The channel region 24 is provided as an N-type impurity region (N-type impurity layer).

The P-type hole pocket region 25 is located below the gate electrode 21 and within the P-type well region 5 near the N-type source region 22, surrounding the N-type source region 22. The P-type hole pocket region 25 is located closer to the N-type source region 22 than to the N-type drain region 23. The P-type hole pocket region 25 is in the shape of a ring, when viewed from the top. The P-type hole pocket region 25 is provided as a P-type high-concentration buried region having an impurity concentration higher than that of the P-type well region 5.

The P-type well region 5 is provided within the N-type well region 7 on a P-type semiconductor substrate 8. The N-type well region 7 is separated from other N-type well regions 7 adjacent thereto via the above-described field oxide film 4 and the P-type separation region 9.

Hereinafter, features of the MOS-based image sensor 20 of Embodiment 1 will be described.

The P-type well region 5 (including the P-type well region 51) is provided between the N-type well region 7 and the N-type impurity diffusion region 6. In other words, the N-type well region 7 surrounding the P-type well region 5 is physically separated from the N-type impurity diffusion region 6 (including the N-type drain region 23) by the P-type well region 5. In addition, a terminal portion 10 (contact $N^+$ portion) for applying a predetermined potential to the N-type well region 7 is provided on a portion of the N-type well region 7 located between the P-type separation region 9 and the P-type well region 5.

On the other hand, in the conventional MOS-based image sensor 20H of FIG. 11, the N-type well region 7H is connected to the N-type impurity diffusion region 6 (including the N-type drain region 23). When a predetermined potential is applied to the N-type drain region 23, the N-type well region 7H and the N-type drain region 23 have the same potential.

In contrast, in the MOS-based image sensor 20 of Embodiment 1, the P-type well region 5 is used to physically separate the N-type impurity diffusion region 6 and the N-type well region 7. Therefore, it is possible to apply a potential to the N-type well region 7 separately from the N-type drain region 23. In this embodiment, a potential VSUBN, which is different from the drain potential VD applied to the N-type drain region 23, is applied from the terminal portion 10 (contact $N^+$ portion) to the N-type well region 7.

Hereafter, a method for driving the MOS-based image sensor 20 according to Embodiment 1 of the present invention will be described with reference to the timing chart of FIG. 2. In this embodiment, during the discharging period, the voltage VSUBN, which is lower than a drain voltage applied to the N-type drain region 23, is applied to the N-type well region 7. The MOS-based image sensor 20 is driven by a control portion for controlling the operation of the MOS-based image sensor 20.

Figure 2:
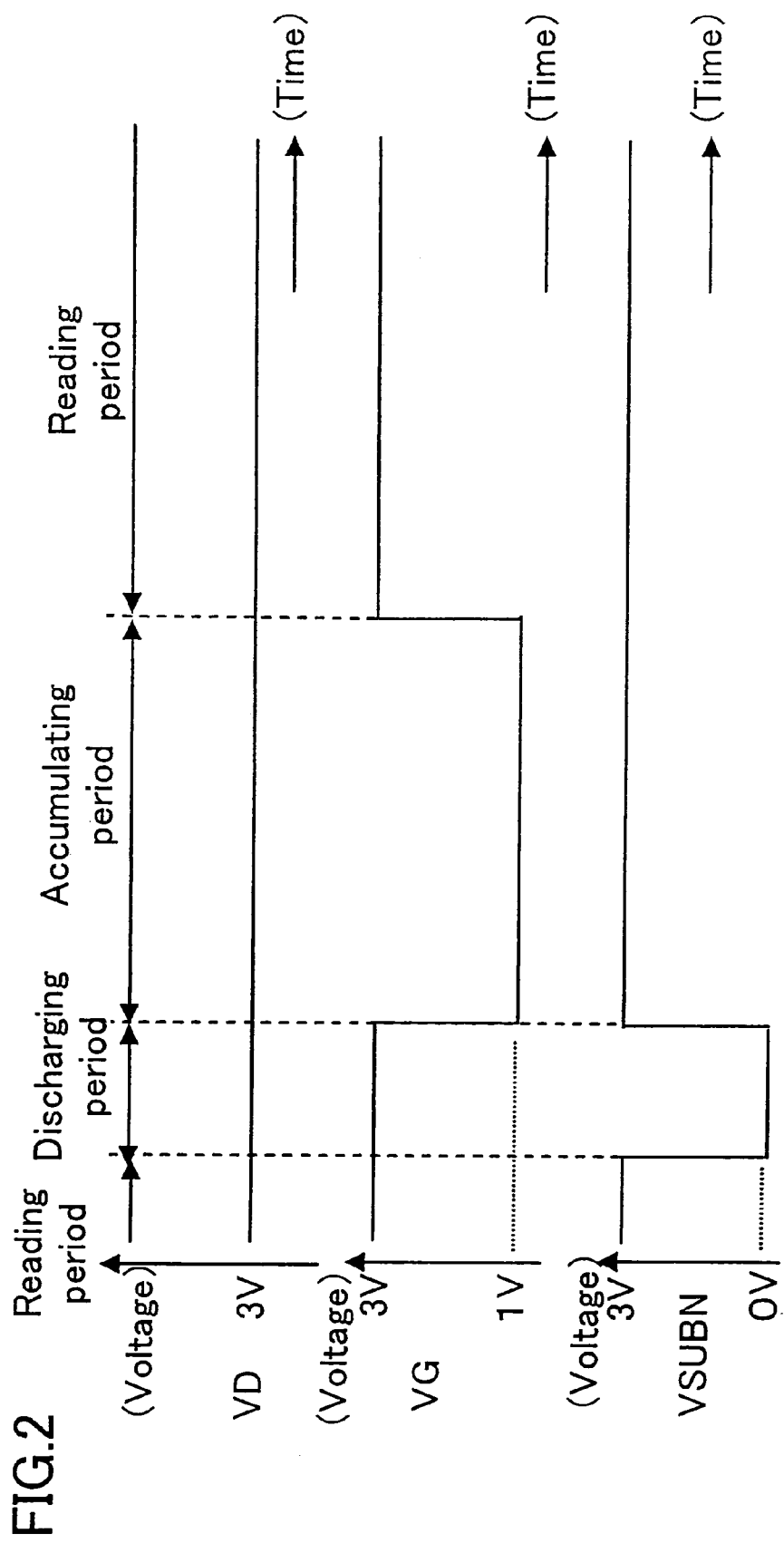
FIG. 2 is a timing chart showing a driving voltage in Embodiment 1.

As shown in FIG. 2, during the discharging period, the drain voltage VD and the gate voltage VG applied to the N-type drain region 23 and the gate electrode 21, respectively, are each 3 V. The voltage VSUBN applied to the N-type well region 7 is 0 V, i.e., is lower than the drain voltage VD and the gate voltage VG. The potential distribution of this situation is shown in FIG. 3.

Figure 3:
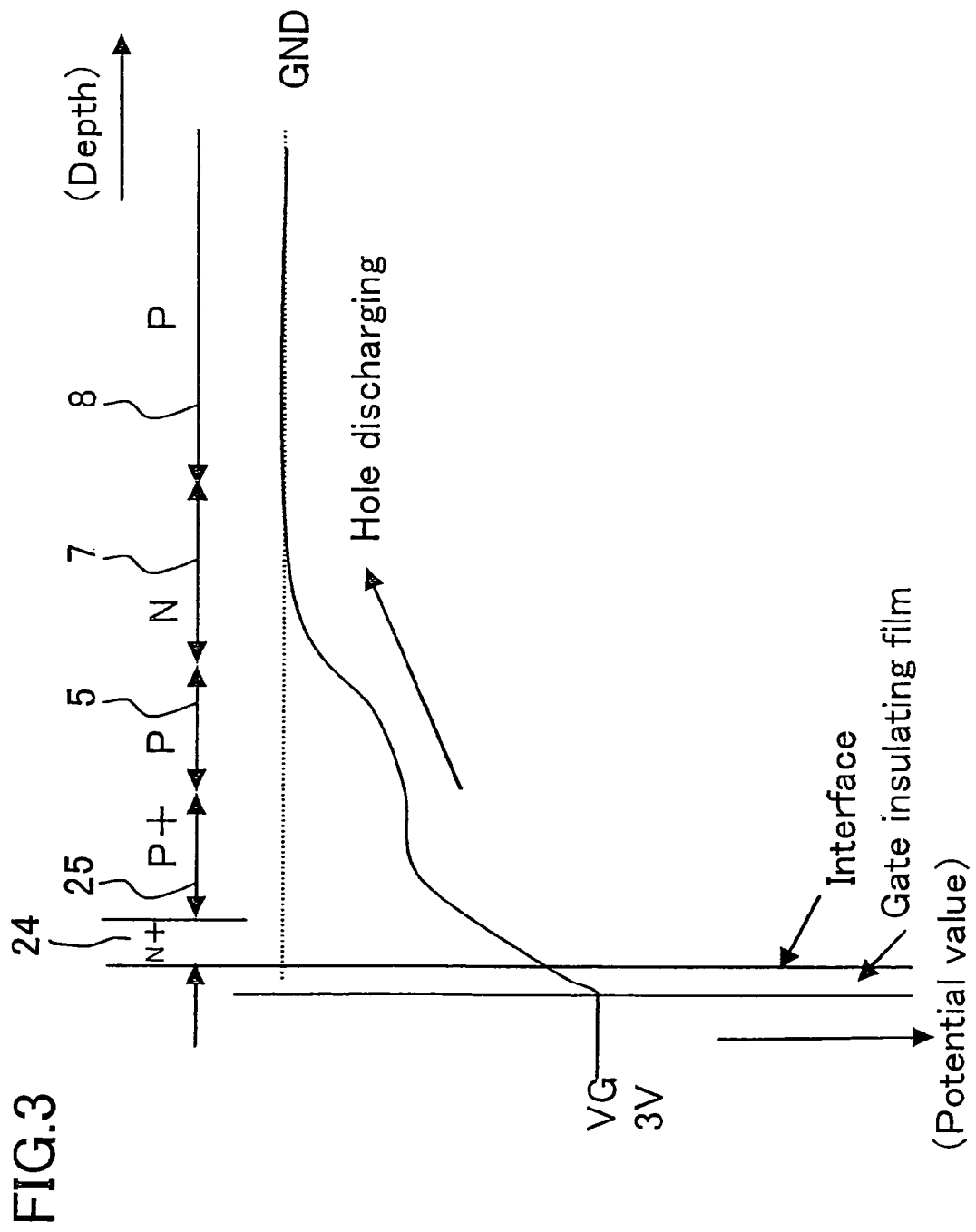
FIG. 3 is a diagram showing a potential distribution during a discharging period according to Embodiment 1 of the present invention.

FIG. 3 is a diagram showing the potential distribution of the device 20 along a plane passing through the hole pocket region 25 in a direction (depth direction) perpendicular to the substrate surface, during the discharging period. The vertical axis represents a potential value, while the horizontal axis represents a depth (distance) from the upper surface of a unit pixel portion.

Referring to FIG. 3, the potential values of the gate insulating film, the N-type (N+) channel region 24, the P-type (P+) hole pocket region 25, the P-type well region 5, the N-type well region 7, and the P-type semiconductor substrate 8 vary from 3 V to GND (0V).

Figure 12:
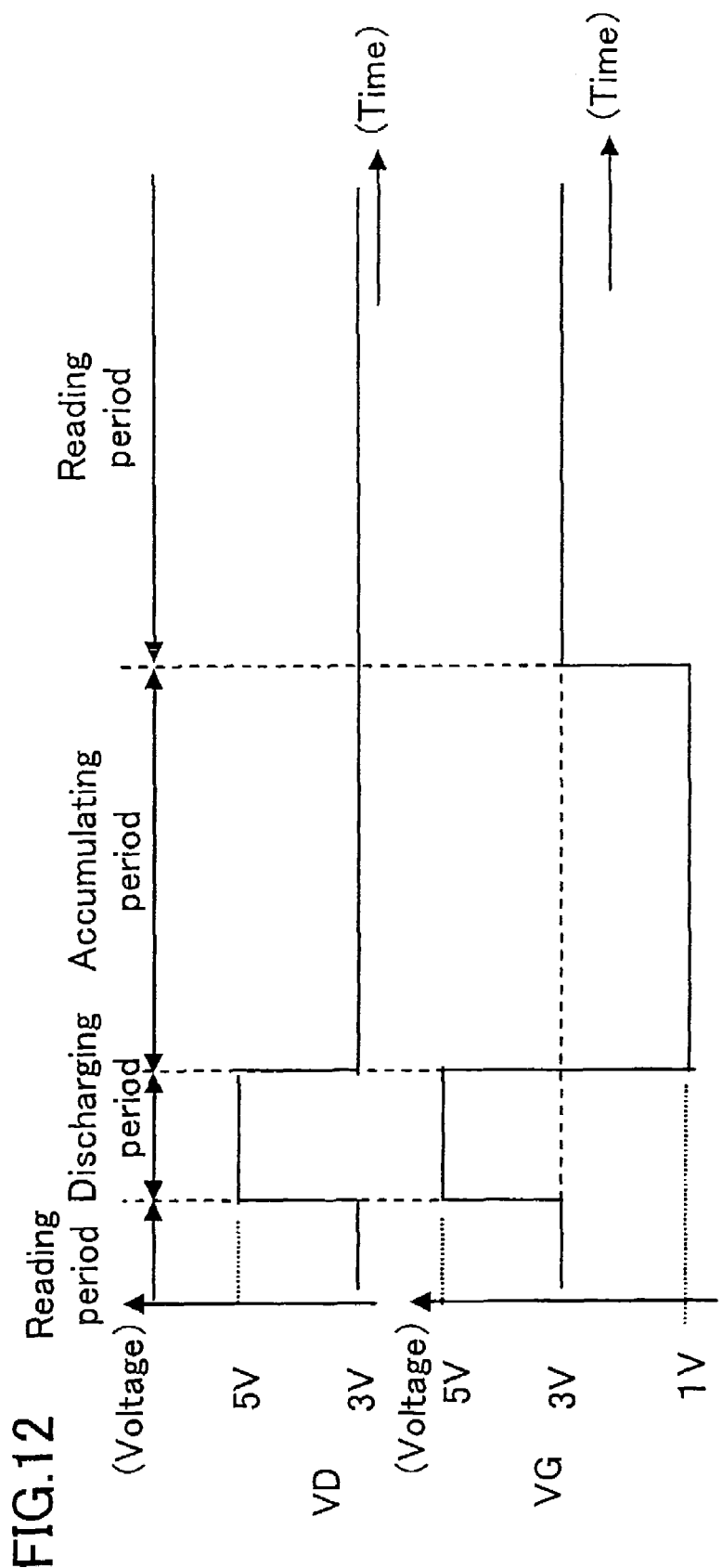
FIG. 12 is a timing chart showing a driving voltage for the conventional solid-state imaging device of FIG. 11.
Figure 13:
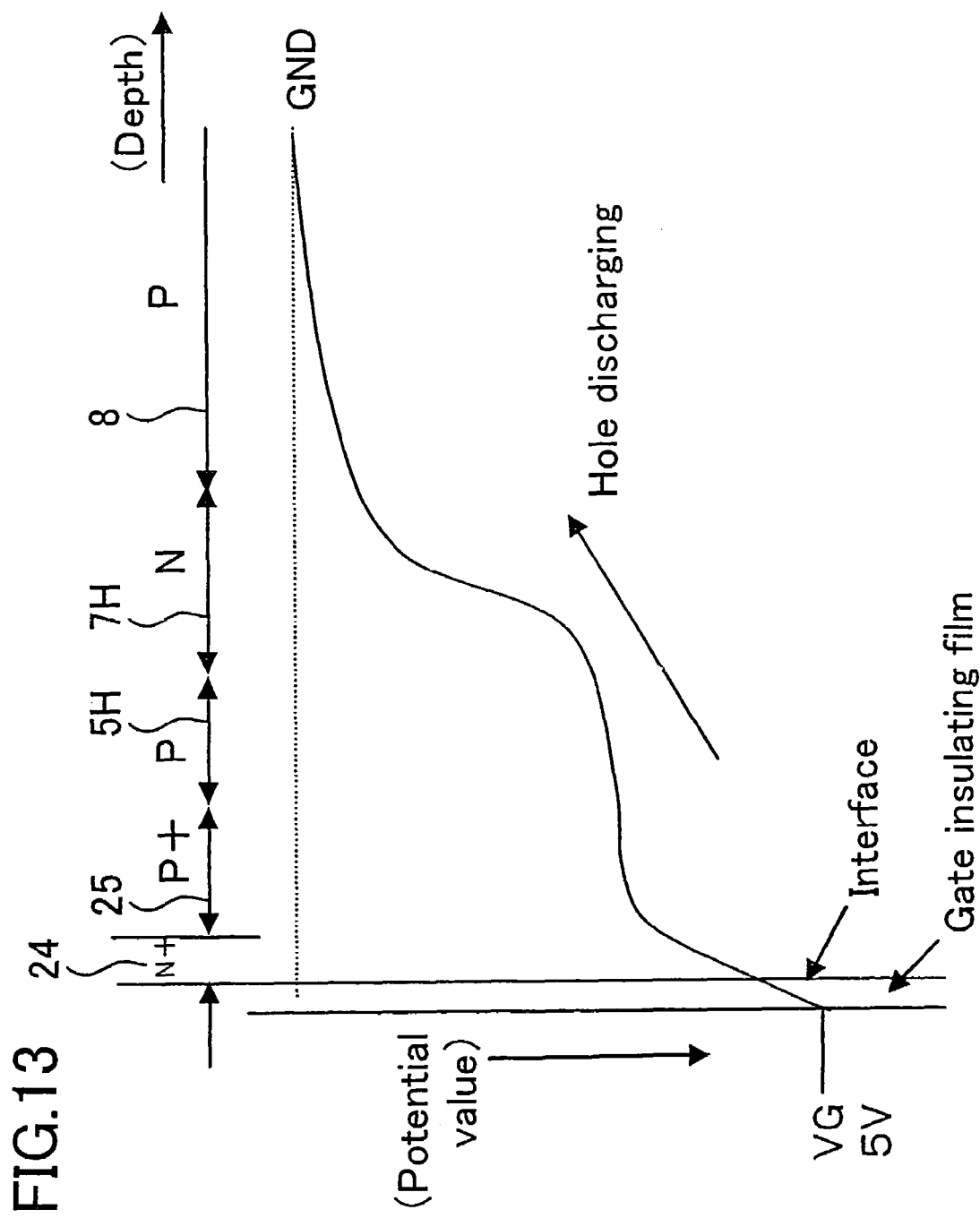
FIG. 13 is a diagram showing a potential distribution during a discharging period of the conventional solid-state imaging device of FIG. 11.

In Embodiment 1, a low voltage (3 V) can be applied to the N-type well region 7. Therefore, as compared with the conventional MOS-based image sensor 20H, a potential barrier formed by the N-type well region 7 is low. As a result, voltages applied to the N-type drain region 23 and the gate electrode 21 during the discharging period can be set to be low (3 V in the embodiment of FIG. 2) as compared to that of conventional devices (5 V in the embodiment of FIG. 12). With such an operation, all electric charges (holes) accumulated in the hole pocket region 25 are discharged to the P-type semiconductor substrate 8.

Next, during an accumulation period, the drain voltage VD is maintained at 3 V as shown in FIG. 2. In this case, electric charges are generated by photoelectric conversion within the P-type well region 51 of the light receiving diode 1. In this case, the gate voltage VG is reduced to 1 V. Thereby, the MOS transistor 2 is turned off, so that electric charges (holes) are accumulated in the hole pocket region 25 which has the lowest potential. In addition, the voltage VSUBN is set to be 3 V which is the same as the drain voltage VD.

Further, during a reading period (the amount of electric charges accumulated in the hole pocket region 25 is read out), a constant current source is connected to the source region 22, and the drain region 23, the gate electrode 21 and the source region 22 form a source follower circuit. In this case, the gate voltage VG is increased to 3 V to operate the MOS transistor 2 at a saturated state thereof. In this case, the source potential is modulated depending on the amount of electric charges accumulated in the hole pocket region 25. By reading a signal indicating such a modulation, the amount of incident light can be detected. Note that the voltage VSUBN is set to be 3 V which is the same as the drain voltage VD.

As described above, according to Embodiment 1 of the present invention, the drain voltage VD and the gate voltage VG required for the discharging operation can be low (3 V in Embodiment 1). Therefore, unlike conventional techniques, it is not necessary to provide a specialized power supply apparatus externally or a booster circuit inside a chip conventional.

(Embodiment 2)

Figure 1B:
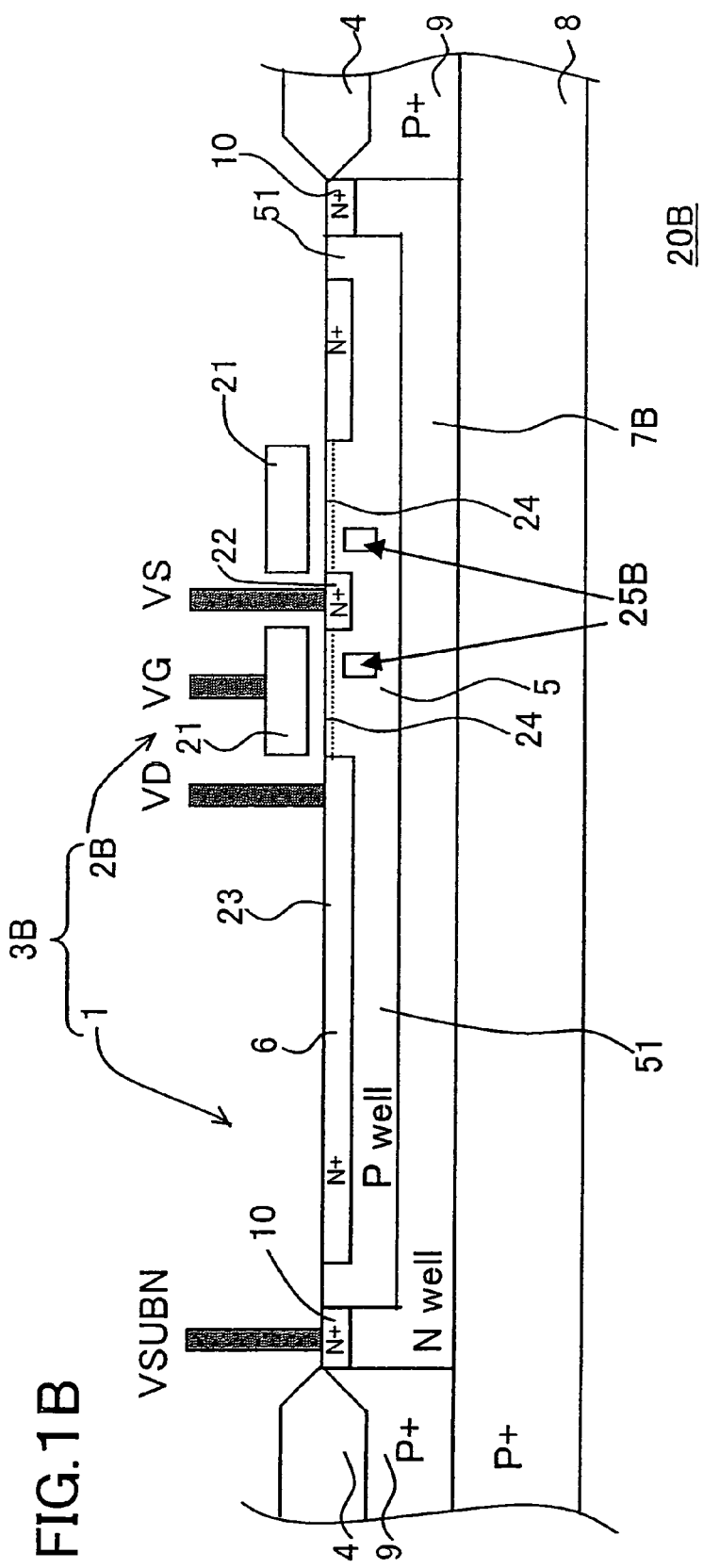
FIG. 1B is a cross-sectional view showing a solid-state imaging device according to Embodiment 2 of the present invention.

FIG. 1B is a cross-sectional view showing a MOS-based image sensor 20B which is a solid-state imaging device according to Embodiment 2 of the present invention. The MOS-based image sensor 20B is a variation of the MOS-based image sensor 20 of FIG. 1A. The same components as those of the MOS-based image sensor 20 of FIG. 1A are referred to by the same reference characters and the description thereof is omitted.

The MOS-based image sensor 20B comprises a MOS transistor 2B, a unit pixel portion 3B, an N-type well region 7B, and a hole pocket region 25B instead of the MOS transistor 2, the unit pixel portion 3, the N-type well region 7, and the hole pocket region 25 contained in the MOS-based image sensor 20.

In Embodiment 1, during a discharging period, the voltage VSUBN which is lower than the drain voltage VD is applied to the N-type well region 7. In Embodiment 2, the impurity concentrations of the hole pocket region 25B and the N-type well region 7B are set to be lower than the impurity concentrations of the hole pocket region 25 and the N-type well region 7 of Embodiment 1, respectively.

Because of the low impurity concentrations of the hole pocket region 25B and the N-type well region 7B, it is possible to allow a voltage required for discharging to be low. In this case, however, as the impurity concentrations of the hole pocket region 25B and the N-type well region 7B are lowered, the maximum amount of electric charges which can be accumulated in the hole pocket region 25 is also decreased. In Example 2, by preventing the reduction in the maximum amount of accumulated electric charges, a more reliable detection of the amount of incident light can be achieved using a lower operation voltage.

In order to prevent a reduction in the maximum amount of accumulated electric charges (due to a operation voltage lowered by reducing impurity concentration in the hole pocket region 25B), the voltage VSUBN is set to be higher than the drain voltage VD in the MOS-based image sensor 20B of Embodiment 2 during the reading period.

Hereinafter, a method for driving the MOS-based image sensor 20B according to Embodiment 2 of the present invention will be described with reference to a timing chart shown in FIG. 4.

Figure 4:
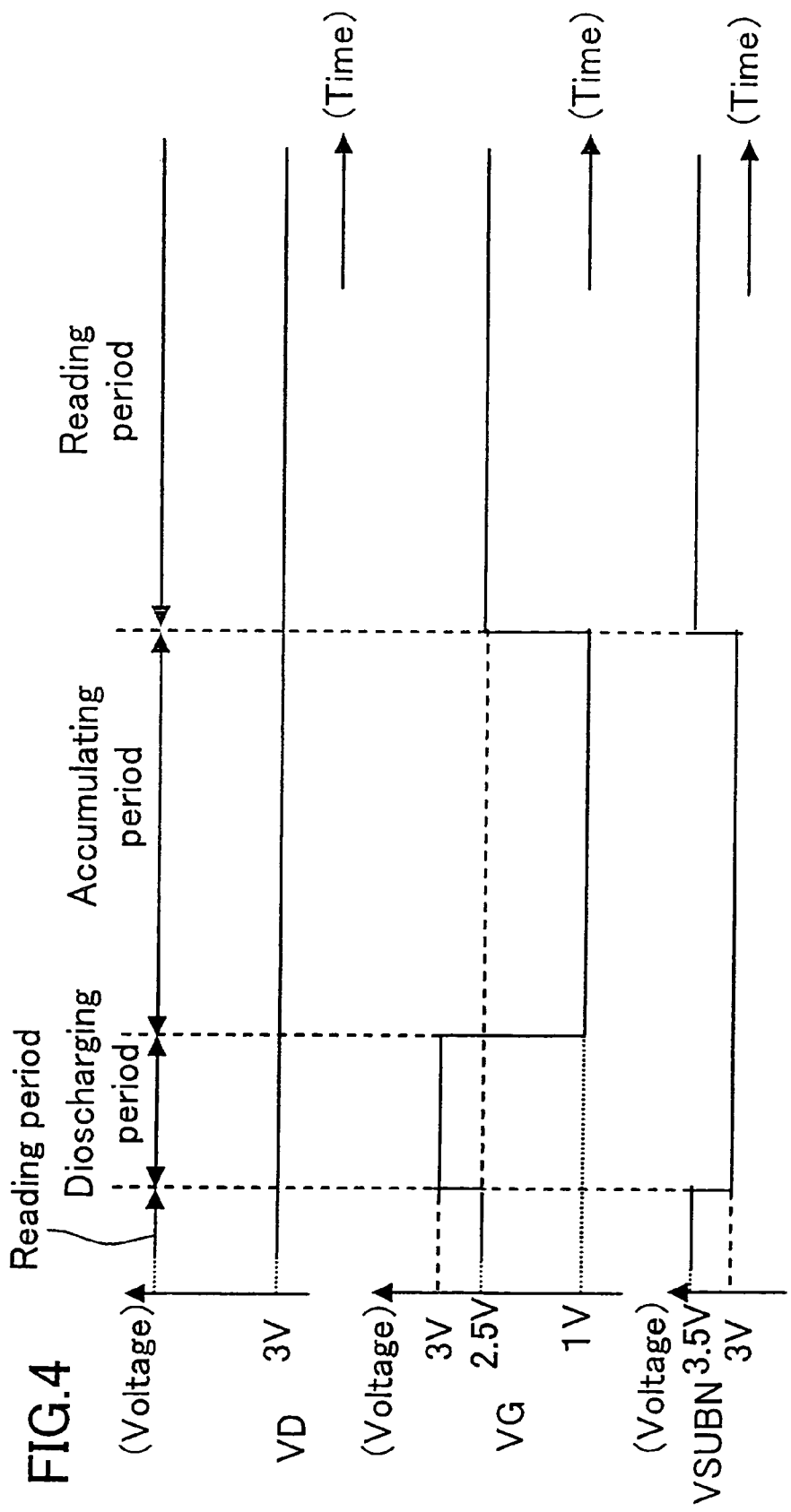
FIG. 4 is a timing chart showing a driving voltage in Embodiment 2.

As shown in FIG. 4, during a discharging period, the voltage VSUBN applied to the N-type well region 7B is 3 V which is the same as the drain voltage VD and the gate voltage VG applied to the drain region 23 and the gate electrode 21, respectively. The impurity concentrations of the hole pocket region 25B and the N-type well region 7B of Embodiment 2 are set to be lower than the impurity concentrations of the conventional hole pocket region 25 and N-type well region 7H of FIG. 12, respectively. Thereby, it is possible to allow operation voltages required for discharging to be lower than that of conventional techniques. In the MOS-based image sensor 20B of Embodiment 2, by setting operation voltages as shown in FIG. 4, all electric charges (holes) accumulated in the hole pocket region 25B can be easily discharged to the P-type semiconductor substrate 8.

Next, during an accumulation period, the drain voltage VD is maintained at 3 V as shown in FIG. 4. In this case, electric charges are generated by photoelectric conversion within the P-type well region 51 of the light receiving diode 1. In this case, the gate voltage VG is reduced to 1 V. Thereby, the MOS transistor 2B is turned off, so that electric charges (holes) are accumulated in the hole pocket region 25B which has the lowest potential. In addition, the voltage VSUBN is set to be 3 V which is the same as the drain voltage VD.

Further, during a reading period, a constant current source is connected to the source region 22, and the drain region 23, the gate electrode 21 and the source region 22 form a source follower circuit. In this case, the gate voltage VG is increased to 2.5 V (lower than the drain voltage 3 V) to operate the MOS transistor 2B at a saturated state thereof. In this case, the source potential is modulated depending on the amount of electric charges accumulated in the hole pocket region 25B. By reading a signal indicating such a modulation, the amount of incident light can be detected. Note that the voltage VSUBN is set to be 3.5 V which is higher than the drain voltage VD (3 V).

Because of the low impurity concentrations of the N-type well region 7B and the hole pocket region 25B, when the same potential is applied to the drain region 23, the gate electrode 21, and the N-type well region 7B, electric charges accumulated in the hole pocket region 25B may overflow into the P-type semiconductor substrate 8. In Embodiment 2, during the reading period, by setting the potential of the N-type well region 7B to be high, the potential barrier formed in the N-type well region 7B can be higher. Thereby, it is possible to prevent electric charges (holes) from overflowing from the N-type well region 7B to the P-type semiconductor substrate 8. Thus, it is possible to prevent a reduction in the maximum amount of electric charges accumulated in the hole pocket region 25B.

As shown in FIG. 4, the gate voltage VG applied to the gate electrode 21 may be set to be low (2.5 V in this embodiment), so that the potential of a potential barrier formed by the N-type well region 7B is set to be substantially the same as an interface potential. Thereby, it is possible to increase the maximum amount of accumulated electric charges. In this case, the interface potential refers to the potential of an interface between the gate insulating film and the channel region 24. The potential distribution of this situation is shown in FIG. 5.

Figure 5:
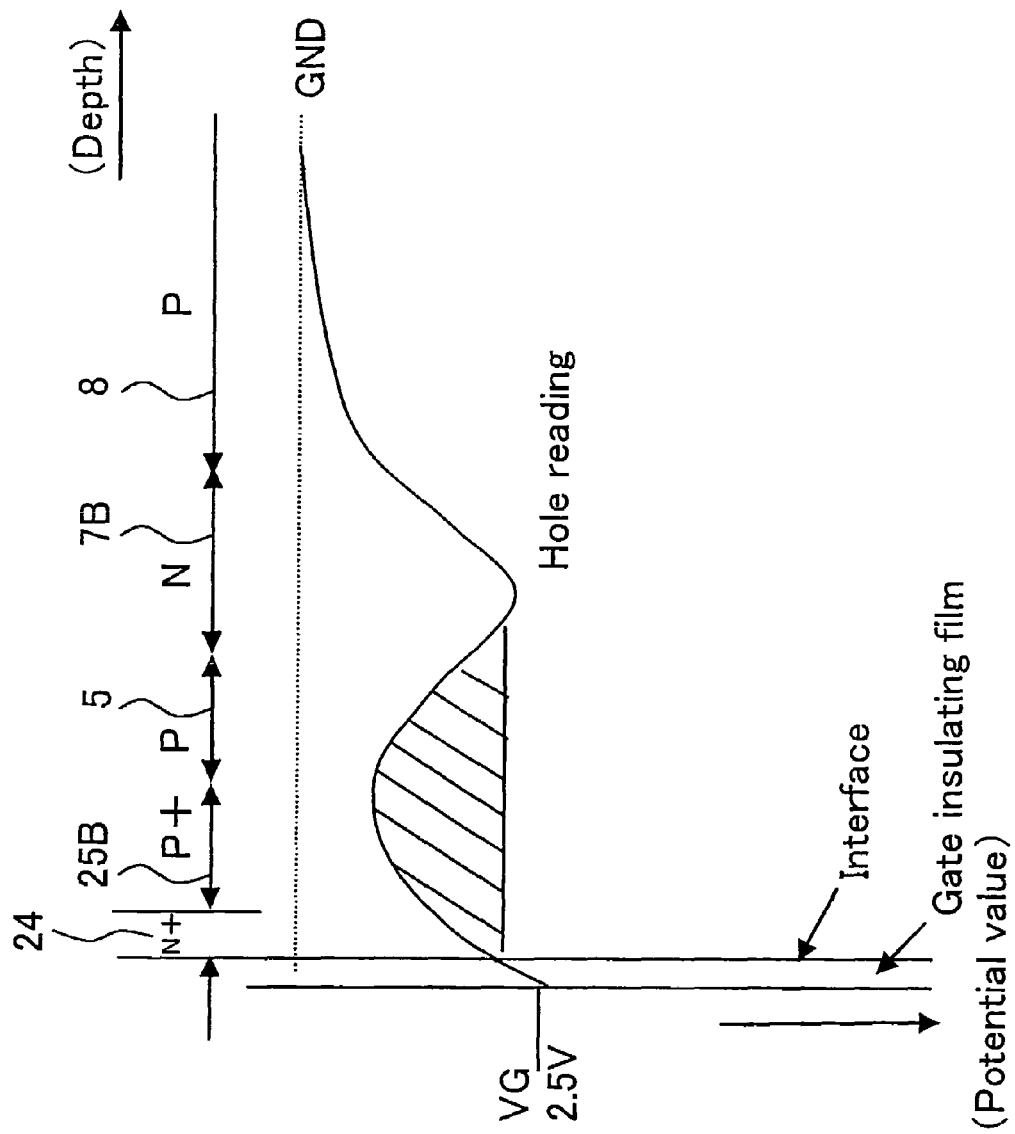
FIG. 5 is a diagram showing a potential distribution during a reading period according to Embodiment 2 of the present invention.

FIG. 5 is a diagram showing the potential distribution of the device 20B along a plane passing through the hole pocket region 25B in a direction (depth direction) perpendicular to the substrate surface, during the reading period. The vertical axis represents a potential value, while the horizontal axis represents a depth (distance) from the upper surface of a unit pixel portion.

Referring to FIG. 5, the potential values of the gate insulating film, the N-type (N+) channel region 24, the P-type (P+) hole pocket region 25B, the P-type well region 5, the N-type well region 7B, and the P-type semiconductor substrate 8 vary from 2.5 V to GND (0V).

A potential barrier formed by the N-type well region 7B has substantially the same potential as the above-described interface potential. Therefore, it is possible to increase the amount of electric charges accumulated in the hole pocket region 25B. The maximum amount of electric charges, which can be accumulated in the hole pocket region 25B, is shown with a hatched portion of FIG. 5. Also, in this case, the voltage VSUBN is about a typical voltage level (3.5 V in the embodiment of FIG. 4). Note that although a voltage of 3.5 V is applied to the N-type well region 7B during the reading period in FIG. 4, the depletion of the N-type well region 7B causes the potential value of the N-type well region 7B to be about 2.5 V in FIG. 5.

(Embodiment 3)

Figure 6A:
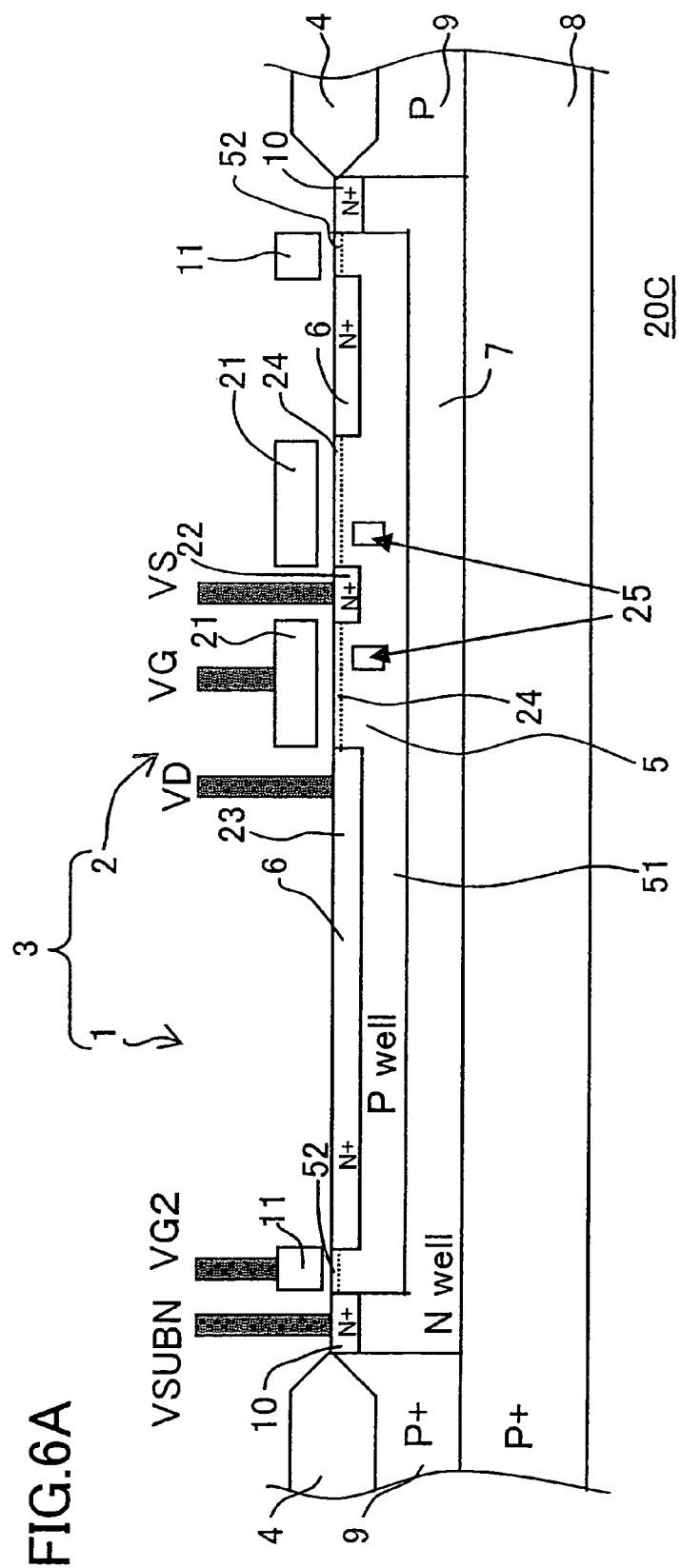
FIG. 6A is a cross-sectional view showing a solid-state imaging device according to Embodiment 3 of the present invention.

FIG. 6A is a cross-sectional view showing a MOS-based image sensor 20C which is a solid-state imaging device according to Embodiment 3 of the present invention. The MOS-based image sensor 20C is a variation of the MOS-based image sensor 20 of FIG. 1A. The same components as those of the MOS-based image sensor 20 of FIG. 1A are referred to by the same reference characters and the description thereof is omitted.

In Embodiment 3, a gate structure is additionally provided to an exposed upper surface of the P-type well region 5 between the N-type impurity diffusion region 6 and the N-type well region 7 in order to provide more reliable electric separation between the N-type drain region 23 and the N-type well region 7 shown in FIGS. 1A and 1B.

In the MOS-based image sensor 20 of FIG. 1A, a portion of the upper surface of the P-type well region 5, which separates the N-type impurity diffusion region 6 from the N-type well region 7, is exposed. When a portion of the upper surface of the P-type well region 5 including the P-type hole pocket region 25 is exposed, a dark current component caused by lattice defects or damages near the upper surface becomes noise, resulting in a deterioration of the S/N ratio.

The MOS-based image sensor 20C comprises a gate terminal 11 via a gate insulating film (not shown) on the exposed upper surface of the P-type well region 5 in order to prevent the deterioration of S/N. In addition, by changing a gate potential VG2 applied to the gate terminal 11, it is possible to change the conduction (electrical connection and electrical cutoff) between the N-type drain region 23 and the N-type well region 7.

A channel region 52 (first conductivity type high-concentration impurity region) is provided at a portion of the P-type well region 51 which is located between the N-type impurity diffusion region 6 and the N-type well region 7 and below the gate terminal 11. In other words, the channel region 52 is formed on an upper surface of the P-type well region 51 adjacent to the N-type impurity diffusion region 6.

Hereinafter, a method for driving the MOS-based image sensor 20C according to Embodiment 3 of the present invention will be described with reference to a timing chart shown in FIG. 7. In this embodiment, the value of the gate voltage VG2 applied to the gate terminal 11 is controlled during the discharging period so that the N-type well region 7 is electrically cut off from the N-type drain region 23. Also, as in FIG. 2, a voltage VSUBN lower than the drain voltage VD is applied to the N-type well region 7 during the discharging period.

As shown in FIG. 7, during the discharging period, the drain voltage VD and the gate voltage VG applied to the N-type drain region 23 and the gate electrode 21, respectively, are each 3 V. The voltage VSUBN applied to the N-type well region 7 is 0 V, i.e., is lower than the drain voltage VD and the gate voltage VG. With such an operation voltage, all electric charges (holes) accumulated in the hole pocket region 25 are discharged to the P-type semiconductor substrate 8 as in Embodiment 1.

In this case, different potentials are applied to the N-type drain region 23 and the N-type well region 7. However, by setting the gate voltage VG2 applied to the gate terminal 11 to be 0 V, the N-type drain region 23 can be electrically cut off from the N-type well region 7 (i.e., the short circuit between the N-type drain region 23 and the N-type well region 7 is prevented). Note that a dark current component may occur near the upper surface of the P-type well region 5 during this short period. However, because all electric charges are discharged to the P-type semiconductor substrate 8 during the discharging period, the S/N ratio is not deteriorated.

Next, during an accumulation period, the drain voltage VD is maintained at 3 V as in the embodiment of FIG. 2. In this case, electric charges are generated by photoelectric conversion within the P-type well region 51 of the light receiving diode 1. In this case, the gate voltage VG is reduced to 1 V. Thereby, the MOS transistor 2 is turned off, so that electric charges (holes) are accumulated in the hole pocket region 25 which has the lowest potential. In addition, the voltage VSUBN is set to be 3 V which is the same as the drain voltage VD. The gate voltage VG2 is also the same as the drain voltage VD (3 V).

During the accumulation period which occupies the most time of the imaging operation, the voltage VG2 is set to be 3 V so that the channel region 52 becomes conductive and the upper surface of the P-type well region 5 is filled with electric charges. Thereby, it is possible to prevent noise due to a dark current component from being mixed into the hole pocket region 25. Because the N-type drain region 23 and the N-type well region 7 are set to be the same potential during the accumulation period, the channel region 52 may be conductive.

Further, during a reading period, a constant current source is connected to the source region 22, and the drain region 23, the gate electrode 21 and the source region 22 form a source follower circuit, as in the embodiment of FIG. 2. In this case, the gate voltage VG is increased to 3 V to operate the MOS transistor 2 at a saturated state thereof. In this case, the source potential is modulated depending on the amount of electric charges accumulated in the hole pocket region 25. By reading a signal indicating such a modulation, the amount of incident light can be detected. Note that the voltage VSUBN and the gate voltage VG2 are set to be 3 V which is the same as the drain voltage VD.

As described above, according to Embodiment 3 of the present invention, the gate voltage VG2 is controlled so that the N-type drain region 23 is electrically connected to the N-type well region 7 during the accumulation period and the reading period. During the discharging period, the gate voltage VG2 is controlled so that the N-type drain region 23 is electrically cut off from the N-type well region 7. Thereby, it is possible to prevent a deterioration in the S/N ratio due to a dark current component, and to reduce the drain voltage VD and the gate voltage VG required for a discharging operation as compared to conventional techniques.

(Embodiment 4)

Figure 6B:
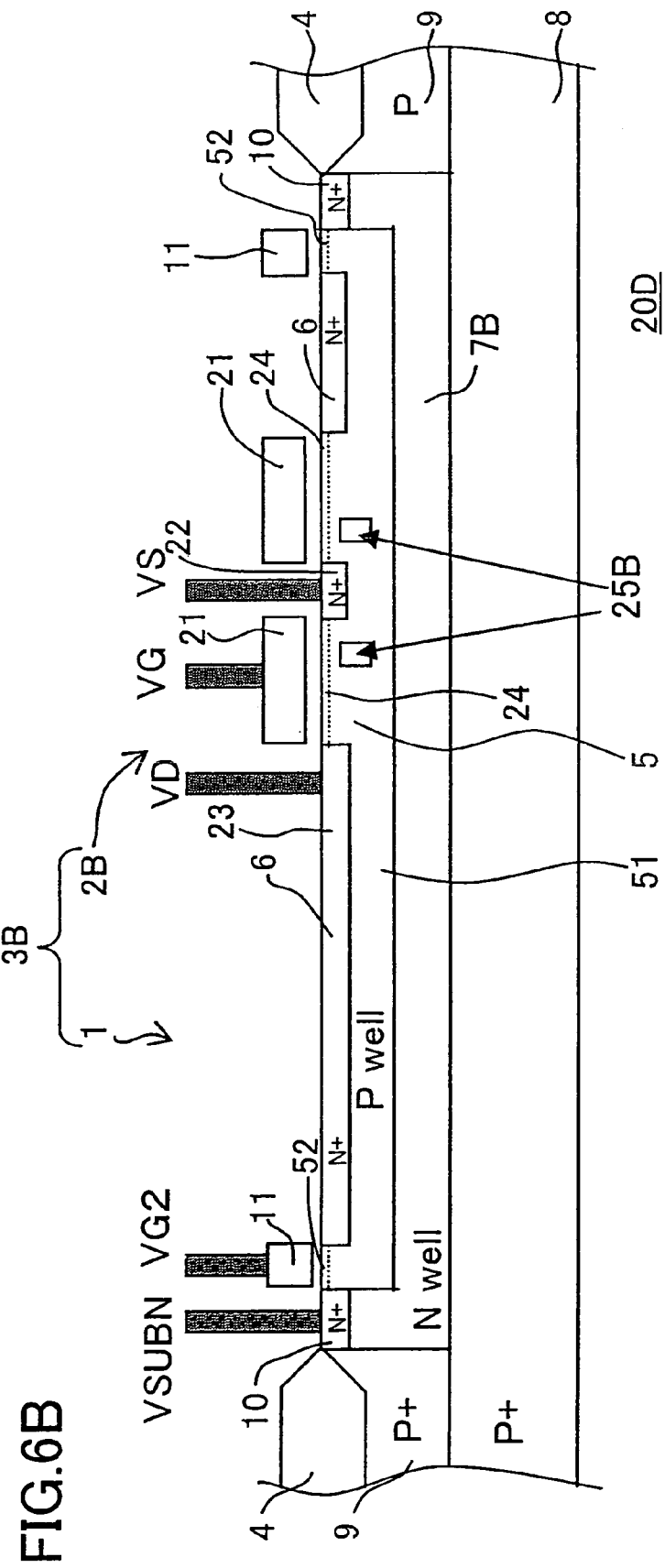
FIG. 6B is a cross-sectional view showing a solid-state imaging device according to Embodiment 4 of the present invention.

FIG. 6B is a cross-sectional view showing a MOS-based image sensor 20D which is a solid-state imaging device according to Embodiment 4 of the present invention. The MOS-based image sensor 20D is a variation of the MOS-based image sensor 20C of FIG. 6A. The same components as those of the MOS-based image sensor 20C of FIG. 6A are referred to by the same reference characters and the description thereof is omitted.

The MOS-based image sensor 20D comprises a MOS transistor 2B, a unit pixel portion 3B, an N-type well region 7B, and a hole pocket region 25B instead of the MOS transistor 2, the unit pixel portion 3, the N-type well region 7, and the hole pocket region 25 contained in the MOS-based image sensor 20C.

In Embodiment 3, during a discharging period, the voltage VSUBN lower than the drain voltage VD is applied to the N-type well region 7. In Embodiment 4, the impurity concentrations of the hole pocket region 25B and the N-type well region 7B are set to be lower than the impurity concentrations of the hole pocket region 25 and the N-type well region 7 of Embodiment 3, respectively. The effects of these features are similar to those described in Embodiment 2.

In this case, the gate voltage VG2 is controlled so that the N-type well region 7B is electrically cut off from the N-type impurity diffusion region 6 (including the drain region 23) during a reading period. Also, as in Embodiment 2, the voltage VSUBN higher than the drain voltage VD is applied to the N-type well region 7B during a reading period.

Hereinafter, a method for driving the MOS-based image sensor 20D according to Embodiment 4 of the present invention will be described with reference to a timing chart shown in FIG. 8.

As shown in FIG. 8, during a discharging period, the voltage VSUBN applied to the N-type well region 7B is 3 V which is the same as the drain voltage VD and the gate voltage VG applied to the drain region 23 and the gate electrode 21, respectively, as in the embodiment of FIG. 4. The impurity concentrations of the hole pocket region 25B and the N-type well region 7B of Embodiment 4 are set to be lower than the impurity concentrations of the conventional hole pocket region 25 and N-type well region 7H of FIG. 12, respectively, as in Embodiment 2. Thereby, it is possible to allow operation voltages required for discharge to be lower than that of conventional techniques. In the MOS-based image sensor 20D of Embodiment 4, by setting operation voltages as shown in FIG. 8, all electric charges (holes) accumulated in the hole pocket region 25B can be easily discharged to the P-type semiconductor substrate 8. In this case, the gate voltage VG2 is 3 V which is the same as the drain voltage VD and the gate voltage VG. The N-type drain region 23 is electrically connected to the N-type well region 7B.

Next, during an accumulation period, the drain voltage VD is maintained at 3 V as in the embodiment of FIG. 4. In this case, electric charges are generated by photoelectric conversion within the P-type well region 51 of the light receiving diode 1. In this case, the gate voltage VG is reduced to 1 V. Thereby, the MOS transistor 2B is turned off, so that electric charges (holes) are accumulated in the hole pocket region 25B which has the lowest potential. In addition, the voltage VSUBN is set to be 3 V which is the same as the drain voltage VD. The gate voltage VG2 is also set to be 3 V which is the same as the drain voltage VD, as in the embodiment of FIG. 7.

During the accumulation period which occupies the most time of the imaging operation, the gate voltage VG2 is set to be 3 V so that the channel region 52 becomes conductive and the upper surface of the P-type well region 51 is filled with electric charges, as in Embodiment 3. Thereby, it is possible to prevent noise due to a dark current component from being mixed into the hole pocket region 25B. Because the N-type drain region 23 and the N-type well region 7B are set to be the same potential during the accumulation period, the channel region 52 may be conductive. In other words, the drain region 23 and the N-type well region 7B may be electrically connected to each other via the channel region 52.

Further, during a reading period, a constant current source is connected to the source region 22, and the drain region 23, the gate electrode 21 and the source region 22 form a source follower circuit, as in the embodiment of FIG. 4. In this case, the gate voltage VG is increased to 2.5 V to operate the MOS transistor 2B at a saturated state thereof. In this case, the source potential is modulated depending on the amount of electric charges accumulated in the hole pocket region 25B. By reading a signal indicating such a modulation, the amount of incident light can be detected. Note that the voltage VSUBN is set to be 3.5 V which is higher than the drain voltage VD (3 V). In this case, different potentials are applied to the N-type drain region 23 and the N-type well region 7B. However, by setting the gate voltage VG2 applied to the gate terminal 11 to be 0 V, the N-type drain region 23 can be electrically cut off from the N-type well region 7B (i.e., the short circuit between the N-type drain region 23 and the N-type well region 7B is prevented).

In Embodiment 4, during the discharging period and the accumulation period, the gate voltage VG2 applied to the gate terminal 11 is controlled so that the N-type drain region 23 is electrically connected to the N-type well region 7B. During the reading period, the gate voltage VG2 is controlled so that the N-type drain region 23 is electrically cut off from the N-type well region 7B. Thereby, it is possible to prevent a deterioration in the S/N ratio due to a dark current component. In addition, by setting the potential of the N-type well region 7B to be as high as 3.5 V and the gate voltage VG applied to the gate electrode 21 to be as low as 2.5 V during the reading period as in Embodiment 2, it is possible to increase a potential barrier formed by the N-type well region 7B. Therefore, it is possible to prevent the overflow of electric charges (hole) to the P-type semiconductor substrate 8. Thus, it is possible to prevent a reduction in the maximum amount of electric charges accumulated in the hole pocket region 25B.

(Embodiment 5)

Figure 9:
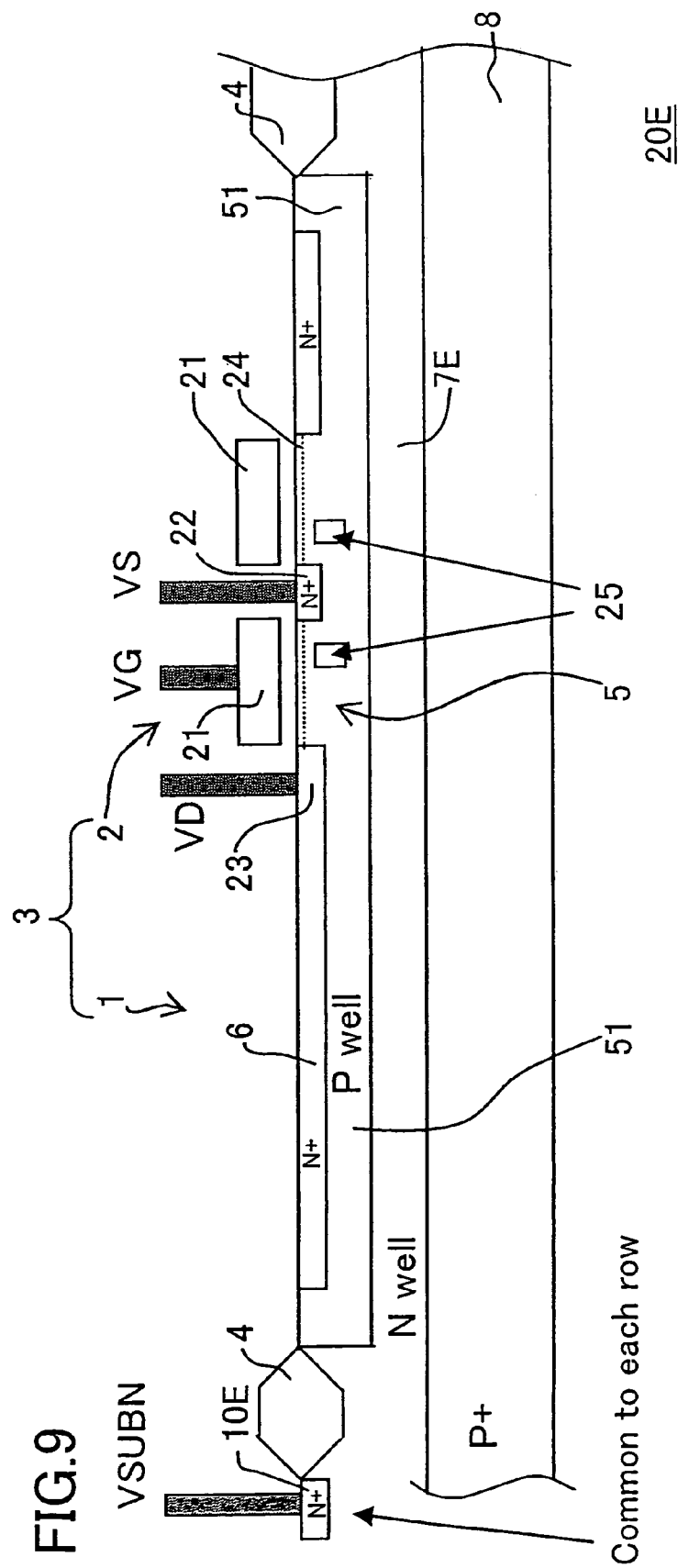
FIG. 9 is a cross-sectional view showing a solid-state imaging device according to Embodiment 5 of the present invention.

FIG. 9 is a cross-sectional view showing a MOS-based image sensor 20E, which is a solid-state imaging device according to Embodiment 5 of the present invention. The MOS-based image sensor 20E is variation of the MOS-based image sensor 20 of FIG. 1A. The same components as those of the MOS-based image sensor 20 of FIG. 1A are referred to by the same reference characters and the description thereof is omitted.

The MOS-based image sensor 20B comprises an N-type well region 7E and a terminal portion 10E instead of the N-type well region 7 and the terminal portion 10 of the MOS-based image sensor 20.

In the MOS-based image sensor 20E, the N-type well region 7E is shared by a plurality of unit pixel portions 3 in a row direction, for example, so that the terminal portion 10E (contact N+ portion) for applying a potential to the N-type well region 7E is provided common to a plurality of unit pixel portions 3 arranged in a row direction, for example, but is not provided for each unit pixel portion.

In solid-state imaging devices, such as CMOS image sensors, MOS-based image sensors, and the like, a series of imaging operations, such as discharging, accumulating, and reading operations, are typically performed for each row. For this reason, it is possible to share an N-type well region 7E for each row. By providing a common terminal portion 10E for each row, the pixel area can be utilized more effectively than in the embodiments of FIGS. 1A and 1B in which a terminal portion 10 is provided each unit pixel. Note that the device of this embodiment can be driven with a method as described in the embodiments of FIGS. 2 and 4.

(Embodiment 6)

Figure 10:
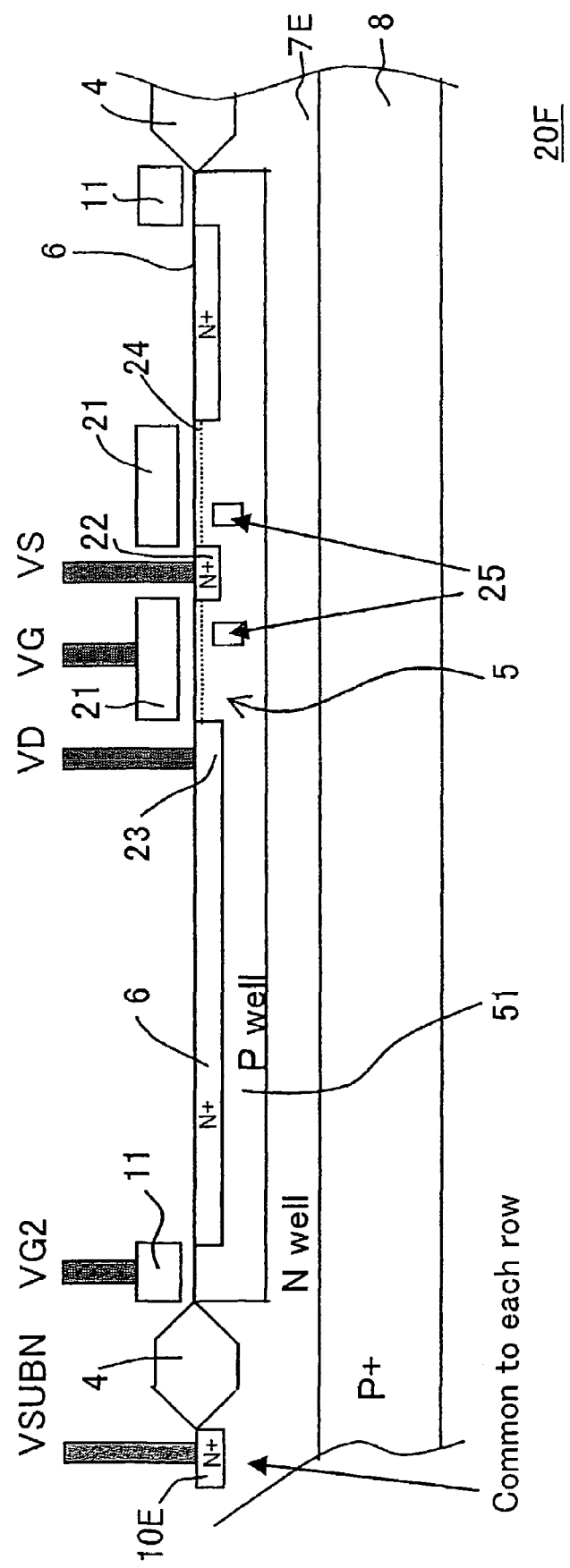
FIG. 10 is a cross-sectional view showing a solid-state imaging device according to Embodiment 6 of the present invention.

FIG. 10 is a cross-sectional view showing a MOS-based image sensor 20F, which is a solid-state imaging device according to Embodiment 6 of the present invention. The MOS-based image sensor 20F is variation of the MOS-based image sensor 20C of FIG. 6A. The same components as those of the MOS-based image sensor 20C of FIG. 6A are referred to by the same reference characters and the description thereof is omitted.

The MOS-based image sensor 20F comprises an N-type well region 7E and a terminal portion 10E instead of the N-type well region 7 and the terminal portion 10 of the MOS-based image sensor 20C.

In the MOS-based image sensor 20F, the N-type well region 7E is shared by a plurality of unit pixel portions 3 in a row direction, for example, so that the terminal portion 10E (contact N+ portion) for applying a potential to the N-type well region 7E is provided common to a plurality of unit pixel portions 3 arranged in, for example, a row direction but is not provided for each unit pixel portion.

A method for driving the MOS-based image sensor 20F can be performed as in the embodiments of FIGS. 7 and 8.

As described above, according to Embodiments 1 to 6, the drain region 23 integrated with the N-type impurity diffusion region 6 is separated from the N-type well region 7 (and 7B, 7E) by the P-type well region 5. Thereby, it is possible to apply a potential lower than that of the N-type drain region 23 to the N-type well region 7 (and 7B, 7E) during the discharging period. Also, it is possible to apply a potential higher than that of the N-type drain region 23 to the N-type well region 7 (and 7B, 7E) during the reading period. As a result, it is possible to discharge electric charges to the P-type semiconductor substrate 8 during the discharging period using a typical operation voltage which is lower than a high voltage used in conventional techniques. Therefore, a special external power supply apparatus, an internal booster circuit, and the like are not required, thereby making it possible to reduce power consumption and chip size.

Note that although the first conductivity type is P-type while the second conductivity type is N-type in Embodiments 1 to 6, the present invention is not limited to this. Conversely, the first conductivity type may be N-type while the second conductivity type may be P-type. In this case, the effect of the present invention can be obtained.

Note that a solid-state imaging device, which comprises unit pixel portions having other structures as well as the unit pixel portion of the present invention, is also within the scope of the present invention.

According to the present invention, a second conductivity type well region is separated from a second conductivity type impurity diffusion region. Therefore, a potential, which is different from a potential applied to the second conductivity type impurity diffusion region, can be applied to the second conductivity type well region.

During a discharging period, in which electric charges accumulated in a first conductivity type buried region are discharged to a first conductivity type semiconductor substrate, by applying a potential, which is lower than a potential applied to the second conductivity type impurity diffusion region, to the second conductivity type well region, it is possible to reduce a potential barrier formed by the second conductivity type well region between the first conductivity type semiconductor substrate and the first conductivity type buried region. Thereby, as compared with conventional techniques (where the second conductivity type impurity diffusion region has the same potential as that of the second conductivity type well region), it is possible to reduce a voltage applied to the second conductivity type impurity diffusion region or the gate electrode during the discharging period. Therefore, a special external power supply apparatus, an internal booster circuit, and the like are not required, thereby making it possible to reduce power consumption and chip size.

During a period in which electric charges accumulated in the first conductivity type buried region are read out, by applying a potential, which is higher than that applied to the second conductivity type impurity diffusion region, to a second conductivity type well region, it is possible to increase a potential barrier formed by a second conductivity type well region between the first conductivity type semiconductor substrate and the first conductivity type buried region. In this case, it is possible to prevent the overflow of electric charges accumulated in the first conductivity type buried region to the first conductivity type semiconductor substrate. Therefore, even when the impurity concentration of the first conductivity type buried region or the second conductivity type well region is reduced, it is possible to prevent a reduction in the maximum amount of accumulated electric charges.

In addition, a terminal portion for applying a potential to the second conductivity type well region may be shared by a plurality of unit pixel portions arranged in a predetermined direction, thereby making it possible to utilize the areas of pixels effectively. In MOS-based image sensors, a series of imaging operation, such as discharging, accumulating, and reading operations., are typically performed for each row. For this reason, it is preferable to provide a terminal portion for applying a potential to the second conductivity well region, which is common to a plurality of unit pixel portions arranged in a row direction.

Further, a gate terminal is provided in the first conductivity type well region for separating the second conductivity type well region from the second conductivity type impurity diffusion region. By controlling a voltage applied to the gate terminal portion, it is possible to switch the electrical connection and the electrical cutoff between the second conductivity type well region and the second conductivity type impurity diffusion region.

By applying a voltage to the gate terminal portion so that the second conductivity type well region is electrically connected to the second conductivity type impurity diffusion region during the accumulation period, it is possible to prevent a deterioration in S/N due to a dark current component, which occurs in an exposed portion of the first conductivity type well region. Also, it is possible to apply a voltage to the gate terminal to electrically cut off the second conductivity type well region from the second conductivity type impurity diffusion region, during a discharging period (or a reading period), in which a potential different from a potential applied to the second conductivity type impurity diffusion region is applied to the second conductivity type well region.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state imaging device, comprising at least one unit pixel portion,
    wherein each of the at least one unit pixel portion comprises:
        a light receiving portion for subjecting incident light to photoelectric conversion to output electric charges; and
        an optical signal detecting portion comprising a first conductivity type buried region for accumulating the output electric charges,
    wherein the light receiving portion comprises:
        at least a portion of a second conductivity type impurity diffusion region; and
        at least a portion of a first conductivity type well region provided between a second conductivity type well region and the second conductivity type impurity diffusion region, and
    wherein the second conductivity type well region and the second conductivity type impurity diffusion region are separated from each other.

2. A solid-state imaging device according to claim 1, wherein the light receiving portion is a light receiving diode, and the optical signal detecting portion is a transistor.

3. A solid-state imaging device according to claim 2,
    wherein the optical signal detecting portion comprises a second conductivity type drain diffusion region integrated with the second conductivity type impurity diffusion region, a second conductivity type source diffusion region, a gate electrode, and a channel region,
    the first conductivity type buried region is provided within the first conductivity type well region, and the first conductivity type buried region is provided closer to the second conductivity type source diffusion region than to the second conductivity type drain diffusion region, and
    an impurity concentration of the first conductivity type buried region is higher than an impurity concentration of the first conductivity type well region.

4. A solid-state imaging device according to claim 1, further comprising a terminal portion for applying a predetermined potential to the second conductivity type well region.

5. A solid-state imaging device according to claim 4, wherein the solid-state imaging device comprises a plurality of the unit pixel portions arranged in a predetermined direction, and
the terminal portion is shared by the plurality of the unit pixel portions arranged in the predetermined direction.

6. A solid-state imaging device according to claim 1, wherein the second conductivity type impurity diffusion region and the second conductivity type well region are separated from each other via the first conductivity type well region, and
a channel region is provided at a position in the first conductivity type well region, the position being located between the second conductivity type impurity diffusion region and the second conductivity type well region.

7. A solid-state imaging device according to claim 6, further comprising a gate terminal for applying a predetermined potential to the channel region.

8. A solid-state imaging device according to claim 7, wherein a conduction between the second conductivity type well region and the second conductivity type impurity diffusion region varies depending on a change in a potential of the gate terminal.

9. A solid-state imaging device according to claim 3, wherein at least a portion of the second conductivity type well region is provided between a first conductivity type semiconductor substrate and the first conductivity type well region, and
an impurity concentration of each of the second conductivity type well region and the first conductivity type buried region is such that when substantially the same potential is applied to the second conductivity type drain diffusion region, the gate electrode, and the second conductivity type well region, electric charges accumulated in the first conductivity type buried region are transferred to the first conductivity type semiconductor substrate.

10. A method for driving a solid-state imaging device, wherein the solid-state imaging device comprises at least one unit pixel portion,
each of the at least one unit pixel portion comprises:
a light receiving portion for subjecting incident light to photoelectric conversion to output electric charges; and
an optical signal detecting portion comprising a first conductivity type buried region for accumulating the output electric charges,
the light receiving portion comprises:
at least a portion of a second conductivity type impurity diffusion region; and
at least a portion of a first conductivity type well region provided between a second conductivity type well region and the second conductivity type impurity diffusion region, and
the second conductivity type well region and the second conductivity type impurity diffusion region are separated from each other,
wherein at least a portion of the second conductivity type well region is provided between a first conductivity type semiconductor substrate and the first conductivity type well region, and
wherein the method comprises the step of:
applying a potential, which is lower than a potential applied to the second conductivity type impurity diffusion region, to the second conductivity type well region during a period, in which electric charges accumulated in the first conductivity type buried region are discharged to the first conductivity type semiconductor substrate.

11. A method according to claim 10, wherein the second conductivity type impurity diffusion region and the second conductivity type well region are separated from each other via the first conductivity type well region, and
a channel region is provided at a position in the first conductivity type well region, the position being located between the second conductivity type impurity diffusion region and the second conductivity type well region,
wherein the method further comprises the step of:
applying a predetermined potential to the channel region during the discharging period to electrically cut off the second conductivity type impurity diffusion region from the second conductivity type well region.

12. A method for driving a solid-state imaging device, wherein the solid-state imaging device comprises at least one unit pixel portion,
each of the at least one unit pixel portion comprises:
a light receiving portion for subjecting incident light to photoelectric conversion to output electric charges; and
an optical signal detecting portion comprising a first conductivity type buried region for accumulating the output electric charges,
the light receiving portion comprises:
at least a portion of a second conductivity type impurity diffusion region; and
at least a portion of a first conductivity type well region provided between a second conductivity type well region and the second conductivity type impurity diffusion region, and
the second conductivity type well region and the second conductivity type impurity diffusion region are separated from each other, and
wherein the method comprising the step of:
applying a potential, which is higher than a potential applied to the second conductivity type impurity diffusion region, to the second conductivity type well region during a period, in which the amount of electric charges accumulated in the first conductivity type buried region are read out.

13. A method according to claim 12, wherein the second conductivity type impurity diffusion region and the second conductivity type well region are separated from each other via the first conductivity type well region, and
a channel region is provided at a position in the first conductivity type well region, the position being located between the second conductivity type impurity diffusion region and the second conductivity type well region, and
wherein the method further comprises the step of:
applying a predetermined potential to the channel region during the reading period to electrically cut off the second conductivity type impurity diffusion region from the second conductivity type well region.

14. A method according to claim 12,
wherein the optical signal detecting portion comprises a second conductivity type drain diffusion region integrated with the second conductivity type impurity diffusion region, a second conductivity type source diffusion region, a gate electrode, and a channel region, and
wherein the method further comprises the step of:
applying a potential, which is lower than a potential applied to the second conductivity type impurity diffusion region, to the gate electrode during the reading period.

* * * * *